(12) United States Patent
Kang et al.

(10) Patent No.: US 9,992,908 B2
(45) Date of Patent: Jun. 5, 2018

(54) DISPLAY DEVICE

(71) Applicant: SAMSUNG ELECTRONICS CO., LTD., Suwon-si (KR)

(72) Inventors: Joon Kang, Seoul (KR); Jin Hyun Cho, Seoul (KR); Jung Kyun Kim, Seongnam-si (KR); Jin Soo Pyo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 14/988,098

(22) Filed: Jan. 5, 2016

(65) Prior Publication Data

US 2016/0198589 A1 Jul. 7, 2016

(30) Foreign Application Priority Data

Jan. 5, 2015 (KR) .................. 10-2015-0000831
Mar. 31, 2015 (KR) .................. 10-2015-0045573

(51) Int. Cl.
*H05K 7/20* (2006.01)
*G02F 1/1333* (2006.01)

(52) U.S. Cl.
CPC ... *H05K 7/20154* (2013.01); *G02F 1/133385* (2013.01); *G02F 2201/36* (2013.01)

(58) Field of Classification Search
CPC .......... H05K 7/20154; G02F 1/133385; G02F 2201/36
See application file for complete search history.

(56) References Cited

U.S. PATENT DOCUMENTS 4,980,848 A * 12/1990 Griffin .................. G06F 1/203
361/679.09
5,455,458 A * 10/1995 Quon .................. F28D 20/02
257/712

(Continued)

FOREIGN PATENT DOCUMENTS

WO 2007116116 A1 10/2007

OTHER PUBLICATIONS

Communication dated Apr. 28, 2016, issued by the European Patent Office in counterpart European Application No. 15202133.3.

(Continued)

*Primary Examiner* — David M Sinclair
*Assistant Examiner* — Robert Brown
(74) *Attorney, Agent, or Firm* — Sughrue Mion, PLLC

(57) ABSTRACT

Provided is a display apparatus including: a case having an inlet; and an outlet; a display module disposed in the case and including a display panel configured to display an image; and a heat exchange device configured to receive heat from the display module and including: a first portion provided in a first cooling passage, air in the first passage moving over the display module; and a second portion provided in a second cooling passage, air in the second cooling passage moving over the heat exchange device, wherein heat generated from the display module is transferred to the first portion via the air in the first cooling passage, wherein the heat transferred to the first portion is transferred to the second portion, and wherein the air suctioned through the inlet is heat-exchanged in the second cooling passage with the second portion and discharged through the outlet.

38 Claims, 21 Drawing Sheets

(56) References Cited

U.S. PATENT DOCUMENTS

| | | | | |
|---|---|---|---|---|
| 5,832,989 A * | 11/1998 | Osakabe | ............. | F28D 15/0266 165/104.33 |
| 6,279,649 B1 * | 8/2001 | Osakabe | ............. | F28D 15/0266 165/104.21 |
| 6,833,674 B2 * | 12/2004 | Kaneko | ............. | H05K 7/20972 313/11 |
| 7,164,586 B2 * | 1/2007 | Lin | ................... | H05K 7/20972 348/794 |
| 9,529,395 B2 * | 12/2016 | Franz | ................ | H05K 7/20772 |
| 2006/0012959 A1 * | 1/2006 | Lee | ........................... | G06F 1/20 361/700 |
| 2007/0081109 A1 * | 4/2007 | Igarashi | .................. | G06F 1/187 349/58 |
| 2007/0211191 A1 * | 9/2007 | Cho | .................... | G02B 6/0073 349/58 |
| 2008/0165496 A1 * | 7/2008 | Kang | ................ | G02F 1/133308 361/692 |
| 2009/0086430 A1 * | 4/2009 | Kang | ................ | G02F 1/133385 361/695 |
| 2009/0129011 A1 * | 5/2009 | Balzano | ................ | H01L 23/473 361/689 |
| 2009/0260777 A1 * | 10/2009 | Attlesey | .................... | G06F 1/20 165/67 |
| 2009/0277604 A1 * | 11/2009 | Kang | ....................... | G07F 9/00 165/56 |
| 2009/0279240 A1 * | 11/2009 | Karppanen | ....... | G02F 1/133308 361/679.21 |
| 2011/0001898 A1 * | 1/2011 | Mikubo | ............ | G02F 1/133385 349/58 |
| 2011/0013114 A1 * | 1/2011 | Dunn | ................ | G02F 1/133385 349/61 |
| 2011/0085301 A1 * | 4/2011 | Dunn | ..................... | F21V 29/67 361/695 |
| 2012/0160452 A1 * | 6/2012 | Kang | .................... | H01L 23/427 165/104.13 |
| 2012/0236499 A1 * | 9/2012 | Murayama | ......... | H05K 7/20972 361/696 |
| 2013/0077232 A1 * | 3/2013 | Nordin | ............... | H05K 7/20809 361/679.47 |
| 2014/0049914 A1 * | 2/2014 | Campbell | ............. | F28D 1/0471 361/692 |
| 2014/0321054 A1 * | 10/2014 | Kaefer | ............... | H05K 7/20972 361/692 |
| 2014/0346658 A1 * | 11/2014 | Clore | ...................... | H01L 23/24 257/704 |
| 2015/0009625 A1 * | 1/2015 | Chin | .................. | H05K 7/20145 361/695 |
| 2015/0237761 A1 * | 8/2015 | Dunn | ................. | H05K 7/20154 362/97.3 |

OTHER PUBLICATIONS

Communication dated Jul. 18, 2017, issued by the European Patent Office in counterpart European Application No. 15202133.3.

* cited by examiner

DISPLAY DEVICE

CROSS-REFERENCE TO RELATED APPLICATIONS

This application claims priority from Korean Patent Application Nos. 10-2015-0000831 and 10-2015-0045573, respectively filed on Jan. 5, 2015 and Mar. 31, 2015 in the Korean Intellectual Property Office, the disclosures of which are incorporated herein by reference in their entireties.

BACKGROUND

1. Field

Apparatuses consistent with exemplary embodiments relate to a display device including a sealed cooling passage and a circular cooling passage.

2. Description of the Related Art

In the related art, a display device is a device for displaying images on the screen. For example, the display device may include a television, a computer monitor, a digital information display, etc. In recent times, the number of display devices applied to outdoor advertising is rapidly increasing. For example, outdoor billboards and electronic display boards located outside the building may be used as the outdoor advertising display devices.

However, if a display panel of the outdoor display device is directly exposed to sunlight, a surface temperature of the display panel is increased, resulting in the occurrence of panel deterioration.

In addition, the display device includes a display panel (hereinafter referred to as a liquid crystal panel) and a backlight unit configured to provide light to a rear surface of the liquid crystal panel. The liquid crystal panel is formed of one pair of substrates facing each other on the basis of a liquid crystal layer interposed therebetween. The backlight unit includes a light source configured to provide light to a liquid crystal panel. Representative examples of the light source may include a cold-cathode fluorescent plate, a light emitting diode (LED), etc. The light source of the backlight unit generates light and emits heat, resulting in the occurrence of liquid crystal deterioration.

Therefore, the display device includes a cooling device configured to radiate heat from the light source of the backlight unit. The cooling device includes a fan, an air filter, etc. The cooling device suctions the outside air using a fan, forms a cooling passage to cool the front surface of a liquid crystal panel, absorbs solar heat and heat of the liquid crystal panel through the cooling passage, and discharges the absorbed heat to the outside.

The filter of a heat radiation device including the fan and the air filter must be periodically replaced with a new filter, resulting in the occurrence of high maintenance costs. In addition, the heat sink device must simultaneously include the fan and the air filter, such that thickness of a manufactured product is unavoidably increased by thickness of the fan and the air filter.

SUMMARY

One or more exemplary embodiments provide an outdoor display device having a sealed cooling structure to improve cooling efficiency.

One or more exemplary embodiments provide an outdoor display device having a sealed cooling structure in a manner that the outdoor display device is isolated from the external environment, resulting in higher safety.

One or more exemplary embodiments provide an outdoor display device having no air filter, resulting in reduction of production costs.

One or more exemplary embodiments provide an outdoor display device formed in a slim shape, resulting in improvement of product appearance.

Additional aspects of the disclosure will be set forth in part in the description which follows and, in part, will be obvious from the description, or may be learned by practice of the inventive concept In accordance with an aspect of an exemplary embodiment, there is provided a display apparatus including: a case having an inlet and an outlet; a display module disposed in the case, and configured to have a display panel for displaying an image capable of being viewed through at least some parts of the case; and a heat exchange device arranged to receive heat from the display module, and configured to include a first portion disposed over a first cooling passage formed in a manner that air moves to the display module. The heat exchange device receives heat from the first portion, and includes a second portion disposed over a second cooling passage formed in a manner that air moves to the heat exchange device. The second portion receives heat from the first portion and is disposed in a manner that the air suctioned through the inlet is heat-exchanged and discharged outside through the outlet.

The display apparatus may further include: a glass disposed over at least one surface of the case, and configured to protect the display module.

The display apparatus may further include: a cooling plate disposed in the case, and configured to receive heat of the display module.

The cooling plate may include a heat conduction plate, and include any one of copper (Cu), stainless steel, and aluminum (Al).

The first portion may be formed to contact the cooling plate.

The case may include a barrier configured to isolate the first cooling passage from the second cooling passage.

The barrier may be disposed to interconnect the case and the heat exchange device.

The heat exchange device may include: a panel unit disposed between the first portion and the second portion such that the first cooling passage and the second cooling passage are separated from each other.

The barrier may be coupled to the panel unit.

The heat exchange device may include any one of a heat sink, a heat pipe, and a plurality of cooling fins.

The first cooling passage may be formed of a closed space.

The first cooling passage may include a circulation fan formed to circulate the air.

The second cooling passage may include a cooling fan configured in a manner that outside air is suctioned into the case.

The display apparatus may further include: at least one circuit board configured to control the display module, wherein the circuit board is arranged over the second cooling passage.

In accordance with an aspect of another exemplary embodiment, there is provided a display apparatus including a display module disposed in a case having an inlet and an outlet through which air suctioned through the inlet is discharged outside, and configured to display an image capable of being viewed through at least some parts of the case. The display apparatus includes: a cooling plate disposed in the case, and arranged to receive heat from the display module; a heat exchange device contacting the cooling plate, and having a first portion disposed over a first cooling passage formed in a manner that air moves to the display module; and a circulation fan disposed over the first cooling passage to circulate the air. The heat exchange device receives heat from the first portion, and includes a second portion disposed over a second cooling passage formed in a manner that air moves to the heat exchange device. The second portion receives heat from the first portion and is disposed in a manner that the air suctioned through the inlet is heat-exchanged and discharged outside through the outlet.

The inlet and the outlet may be disposed over the second cooling passage; and a cooling fan for suctioning outside air through the inlet may be disposed over the second cooling passage.

The case may include a barrier configured to isolate the first cooling passage from the second cooling passage.

The barrier may be configured to interconnect the case and the heat exchange device.

The cooling plate may include a heat conduction plate, and may include any one of copper (Cu), stainless steel, and aluminum (Al).

The heat exchange device may include any one of a heat sink, a heat pipe, and a plurality of cooling fins.

The display apparatus may further include: at least one circuit board configured to control the display module, wherein the circuit board is disposed over the second cooling passage.

In accordance with an aspect of another exemplary embodiment there is provided a display apparatus including: a case having an inlet and an outlet; and a display module disposed in the case. The display module includes: a display panel; a cooling plate disposed at a rear of the display panel, and configured to transmit heat through phase change of refrigerant; a heat transmission member configured to contact the cooling plate; a first cooling passage formed in a manner that air circulates around the heat transmission member; and a second cooling passage configured in a manner that air suctioned through the inlet is heat-exchanged with the heat transmission member and then discharged through the outlet.

The first cooling passage and the second cooling passage may be isolated from each other.

The display apparatus may further include: a partition member disposed to isolate the first cooling passage and the second cooling passage from each other.

The partition member may be arranged in the vicinity of the heat transmission member, and may be configured to isolate the heat transmission member from the first cooling passage.

The partition member may include rubber, silicon, and elastic material.

The partition member may be disposed between the cooling plate and the case.

The first cooling passage may be formed of a closed space, and may include a circulation fan configured to move internal air of the first cooling passage.

The second cooling passage may include a cooling fan configured to receive outside air.

The heat transmission member may include any one of a heat sink and a heat exchanger.

The display apparatus may further include: a circuit board configured to control the display module, wherein the circuit board is disposed over the first cooling passage.

In accordance with an aspect of another exemplary embodiment, there is provided a display apparatus including: a case having an inlet and an outlet; and a display module disposed in the case. The display module includes: a display panel; a cooling plate disposed at a rear of the display panel, and configured to transmit heat through phase change of refrigerant; a first cooling passage formed to cool the cooling plate; and a second cooling passage configured in a manner that air suctioned through the inlet is heat-exchanged with the cooling plate and then discharged through the outlet. The second cooling passage is formed to be isolated from the first cooling passage.

The display apparatus may further include: a heat exchange device configured to contact the cooling plate.

The heat exchange device may include any one of a heat exchanger, a heat sink, and a heat pipe.

The heat exchange device may be disposed over the first cooling passage.

The heat exchange device may be disposed over the second cooling passage.

The display apparatus may further include: a glass provided over at least one surface of the case, and configured to protect the display module.

The cooling plate may include a heat conduction plate, and may include any one of copper (Cu), stainless steel, and aluminum (Al).

The cooling plate may include a plurality of heat pipes, wherein the plural heat pipes are radially arranged outward from a center part.

The first cooling passage may be formed of a closed space, and may include a circulation fan formed to circulate internal air of the first cooling passage.

The second cooling passage may include a cooling fan formed to receive outside air.

In accordance with an aspect of another exemplary embodiment, there is provided a display apparatus including: a case including: an inlet; and an outlet; a display module disposed in the case and comprising a display panel configured to display an image; and a heat exchange device configured to receive heat from the display module and including: a first portion provided in a first cooling passage, air in the first passage moving over the display module; and a second portion provided in a second cooling passage, air in the second cooling passage moving over the heat exchange device, wherein heat generated from the display module is transferred to the first portion of the heat exchange device via the air in the first cooling passage, wherein the heat transferred to the first portion is transferred to the second portion, and wherein the air suctioned through the inlet is heat-exchanged in the second cooling passage with the second portion and discharged to an exterior of the display apparatus through the outlet.

The display apparatus may further include a glass provided over at least one surface of the case and configured to protect the display module.

The display apparatus may further include a cooling plate provided in the case and configured to receive heat of the display module.

The cooling plate may include a heat conduction plate, and includes at least one of copper (Cu), stainless steel, and aluminum (Al).

The first portion may be configured to contact the cooling plate.

The case may include a barrier configured to isolate the first cooling passage and the second cooling passage from each other.

The barrier may be configured to connect the case and the heat exchange device.

The heat exchange device may include a panel unit provided between the first portion and the second portion, and wherein the panel unit is configured to separate the first cooling passage and the second cooling passage from each other.

The barrier may be coupled to the panel unit.

The heat exchange device may include at least one of a heat sink, a heat pipe, and a plurality of cooling fins.

The first cooling passage may be formed of a closed loop passage.

The first cooling passage may include a circulation fan configured to circulate the air.

The second cooling passage may include a cooling fan configured to suction outside air into the case.

The display apparatus may further include: a circuit board configured to control the display module, wherein the circuit board may be provided over the second cooling passage.

In accordance with an aspect of another exemplary embodiment, there is provided a display apparatus including a display module provided in a case having an inlet and an outlet through which air suctioned into the display apparatus through the inlet is discharged outside, the display module configured to display an image, the display apparatus including: a cooling plate disposed in the case, and configured to receive heat from the display module; a heat exchange device contacting the cooling plate, and including: a first portion provided in a first cooling passage, air in the first cooling passage moves over the display module; and a second portion provided in a second cooling passage, air in the second cooling passage moving over the heat exchange device; and a circulation fan provided over the first cooling passage to circulate the air, wherein heat from the cooling plate is transferred to the first portion of the heat exchange device, wherein the heat transferred to the first portion is transferred to the second portion, and wherein the air suctioned through the inlet is heat-exchanged in the second cooling passage with the second portion and discharged to an exterior of the display apparatus through the outlet.

The inlet and the outlet may be disposed over the second cooling passage; and a cooling fan configured to suction the air through the inlet may be disposed over the second cooling passage.

The case may include a barrier configured to isolate the first cooling passage and the second cooling passage from each other.

The barrier may be configured to connect the case and the heat exchange device.

The cooling plate may include a heat conduction plate, and may include at least on of one of copper (Cu), stainless steel, and aluminum (Al).

The heat exchange device may include at least one of a heat sink, a heat pipe, and a plurality of cooling fins.

The display apparatus may further include: a circuit board configured to control the display module, wherein the circuit board may be disposed over the second cooling passage.

In accordance with an aspect of another exemplary embodiment, there is provided a display apparatus including: a case including: an inlet; and an outlet; and a display module provided in the case, wherein the display module includes: a display panel; a cooling plate disposed at a rear of the display panel, and configured to transfer heat through phase change of refrigerant; a heat transfer member configured to contact the cooling plate; a first cooling passage, air in the first cooling passage circulating around the heat transfer member; and a second cooling passage, air suctioned through the inlet being heat-exchanged in the second cooling passage with the heat transfer member and the heat-exchanged air being discharged through the outlet.

The display apparatus may further include a partition member configured to isolate the first cooling passage and the second cooling passage from each other.

The partition member may be arranged to surround the heat transfer member, and the partition member may be configured to isolate the heat transfer member from the first cooling passage.

The partition member may be made up of at least one of rubber, silicon, and elastic material.

The partition member may be provided between the cooling plate and the case in a case thickness direction.

The first cooling passage may be formed of a closed loop passage, and comprises a circulation fan configured to move internal air of the first cooling passage.

The second cooling passage may include a cooling fan configured to suction outside air.

The heat transfer member may include at least one of a heat sink and a heat exchanger.

The display apparatus may further include: a circuit board configured to control the display module, wherein the circuit board may be disposed over the first cooling passage.

In accordance with an aspect of another exemplary embodiment, there is provided a display apparatus including: a case including: an inlet; and an outlet; and a display module provided in the case, wherein the display module includes: a display panel; a cooling plate provided at a rear of the display panel, and configured to transfer heat through phase change of refrigerant; a first cooling passage configured to cool the cooling plate; and a second cooling passage, air suctioned through the inlet being heat-exchanged with the cooling plate in the second cooling passage and the heat-exchanged air being discharged through the outlet, wherein the second cooling passage is isolated from the first cooling passage.

The display apparatus may further include a heat exchange device configured to contact the cooling plate.

The heat exchange device may include at least one of a heat exchanger, a heat sink, and a heat pipe.

The heat exchange device may be disposed over the first cooling passage.

The heat exchange device may be disposed over the second cooling passage.

The display apparatus may further include: a glass provided over at least one surface of the case and configured to protect the display module.

The cooling plate may include a heat conduction plate, and made with at least one of copper (Cu), stainless steel, and aluminum (Al).

The cooling plate may include a plurality of heat pipes and the plural heat pipes are radially arranged outward from a center part of the cooling plate.

The first cooling passage may be formed of a closed loop passage, and comprises a circulation fan configured to circulate internal air of the first cooling passage.

The second cooling passage may include a cooling fan configured to suction outside air into the display apparatus.

BRIEF DESCRIPTION OF THE DRAWINGS

The above and/or other aspects of the disclosure will become apparent and more readily appreciated from the following description of the embodiments, taken in conjunction with the accompanying drawings of which.

DETAILED DESCRIPTION

Figure 1:
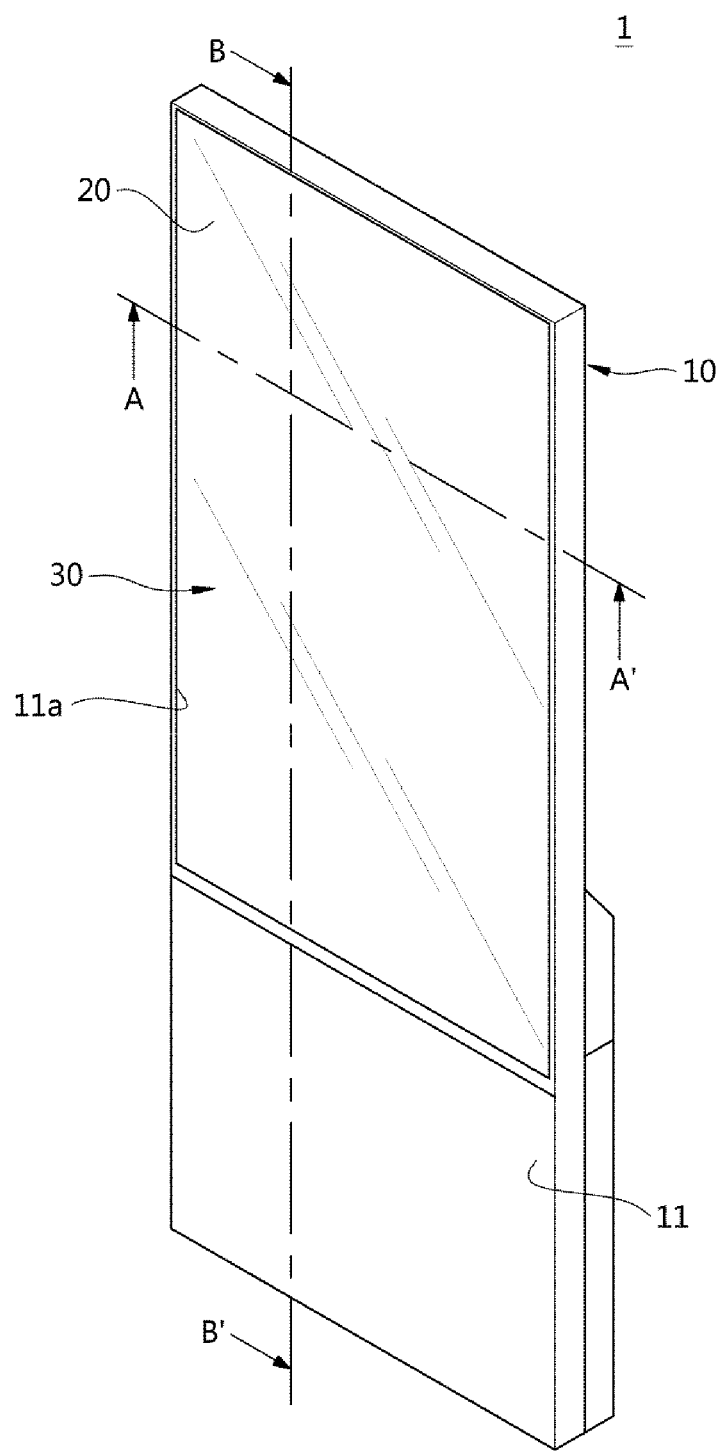
FIG. 1 is a perspective view illustrating a display device according to an exemplary embodiment.

Reference will now be made in detail to the exemplary embodiments, examples of which are illustrated in the accompanying drawings, wherein like reference numerals refer to like elements throughout.

The display device according to the embodiments will hereinafter be described with reference to the attached drawings. Terms "front end", "rear end", "upper part," "lower part," "upper end," and "lower end" are defined based on the drawings and do not limit shapes and positions of components.

FIGS. 1 to 9 illustrate an outdoor display device according to an exemplary embodiment.

Figure 2:
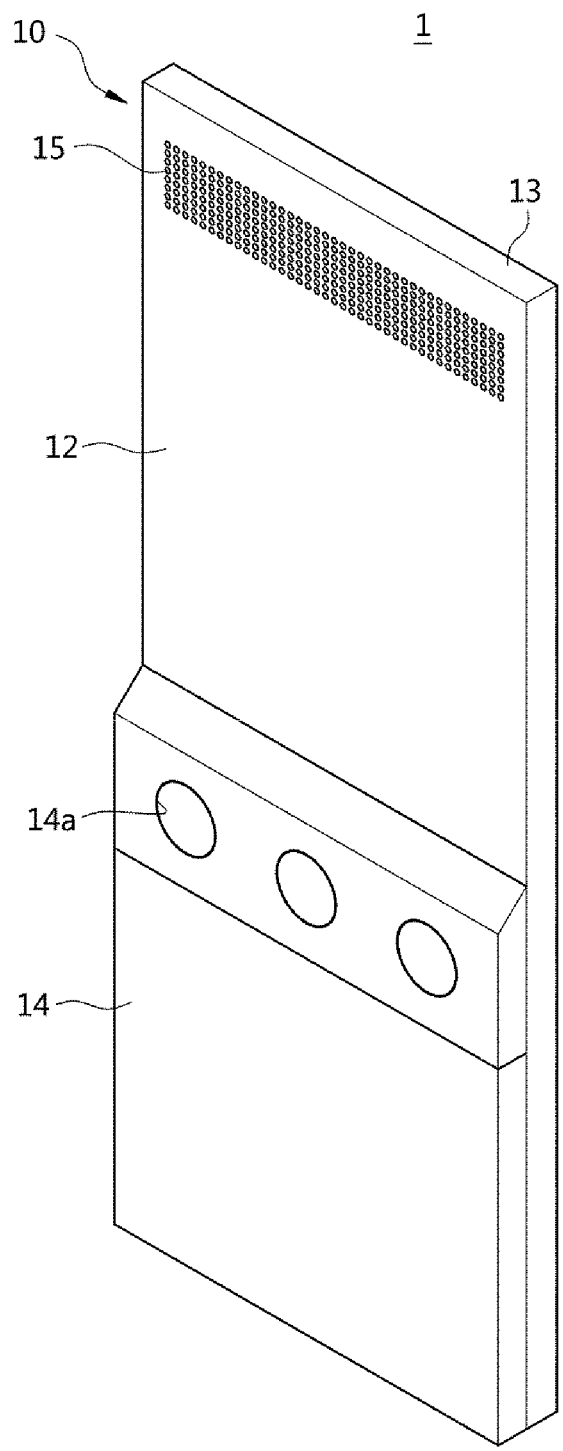
FIG. 2 is a rear perspective view illustrating a display device according to an exemplary embodiment.
Figure 3:
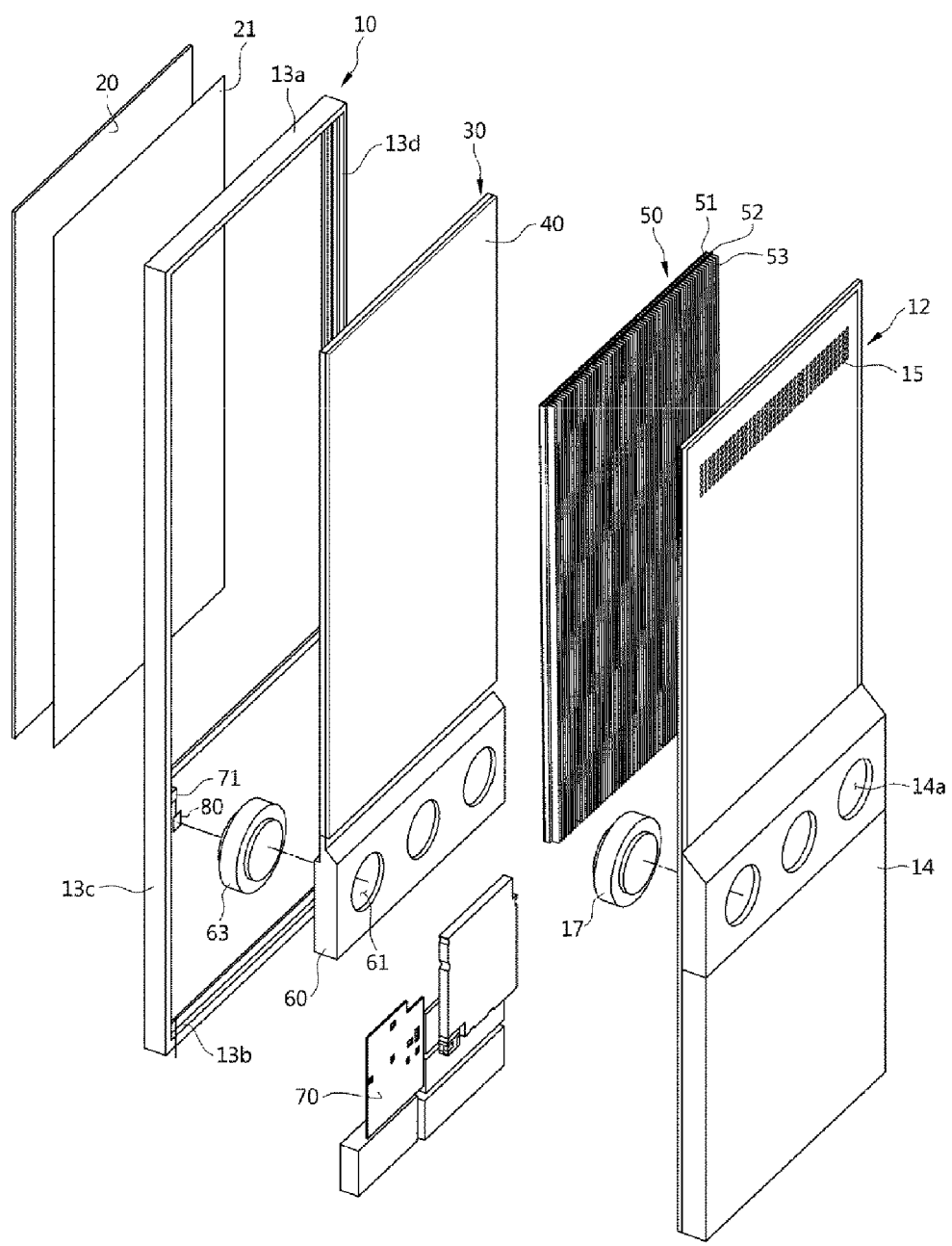
FIG. 3 is an exploded perspective view illustrating a display device according to an exemplary embodiment.

Referring to FIGS. 1 to 3, the display device 1 may include a case 10 which forms the external appearance thereof and includes an opening 11a located at a front side of the case 10; a glass 20 located in the opening 11a of the case 10; and a display module 30 contained in the case 10 to display images thereon.

The case 10 is installed outdoors, includes a front surface 11 and a rear surface 12, and includes a plurality of side surfaces 13 connected between the front surface 11 and the rear surface 12. The side surface 13 may include a top surface 13a, a bottom surface 13b, a left side surface 13c, and a right side surface 13d.

The opening 11a may be formed in at least some parts of the front surface 11. Although the embodiment has exemplarily disclosed that the opening 11a is formed in some parts of the upper part of the front surface 11 of the case 10 and the glass 20 is formed in at least some parts of the front surface 11 for convenience of description, the scope or spirit of the present inventive concept is not limited thereto. For example, the opening 11a may be formed in the entire front surface 11, and the entire front surface 11 may be formed of the glass 20 as necessary.

The glass 20 formed in the opening 11a of the front surface 11 may be formed of a transparent material including a transparent member (such as a tempered glass) having superior hardness or rigidity.

A film 21 for blocking out reflective light caused by external light may be disposed at the inner surface of the glass 20. The film 21 may include a polarization film, etc. The glass 20 may be formed to have a predetermined size corresponding to the display module 30 contained in the case 10, such that a user located outdoors can view images displayed on the display module 30 installed in the case 10.

An installation unit 14 for installing a circuit board 70 and the like may be provided at the rear surface. The installation unit 14 may be incorporated with the rear surface 12, and may protrude backward from the rear surface 12.

A suction inlet 14a through which outside air is introduced into the case 10 may be formed in the installation unit 14 of the case 10. A plurality of suction inlets 14a may be formed. Although the embodiment has exemplarily disclosed that three suction inlets 14a are spaced apart from one another by a predetermined distance for convenience of description, the scope or spirit of the present inventive concept is not limited thereto. For example, the size and number of suction inlets may be changed according to the size or shape of the display device.

A discharge outlet 15 through which the outside air received through the suction inlet 14a is discharged to the outside is formed in an upper end of the rear surface 12 of the case 10. A plurality of discharge outlets 15 may be formed.

The case 10 may include a display module 30 and a frame 60 configured to support the display module 30.

The frame 60 is fixed at an inner lower part of the front surface 11 of the case 10, such that the frame 60 can support the display module 30.

A blowing fan installation hole 61 in which a circulation fan 63 for circulation of the internal air of the case 10 is installed may be formed in the frame 60. A plurality of blowing fan installation holes 61 may be formed. Although the embodiment has exemplarily disclosed that three blowing fan installation holes are installed for convenience of description, the scope or spirit of the present inventive concept is not limited thereto. For example, the size and number of blowing fan installation holes may be changed according to the size or shape of the display device.

Figure 6:
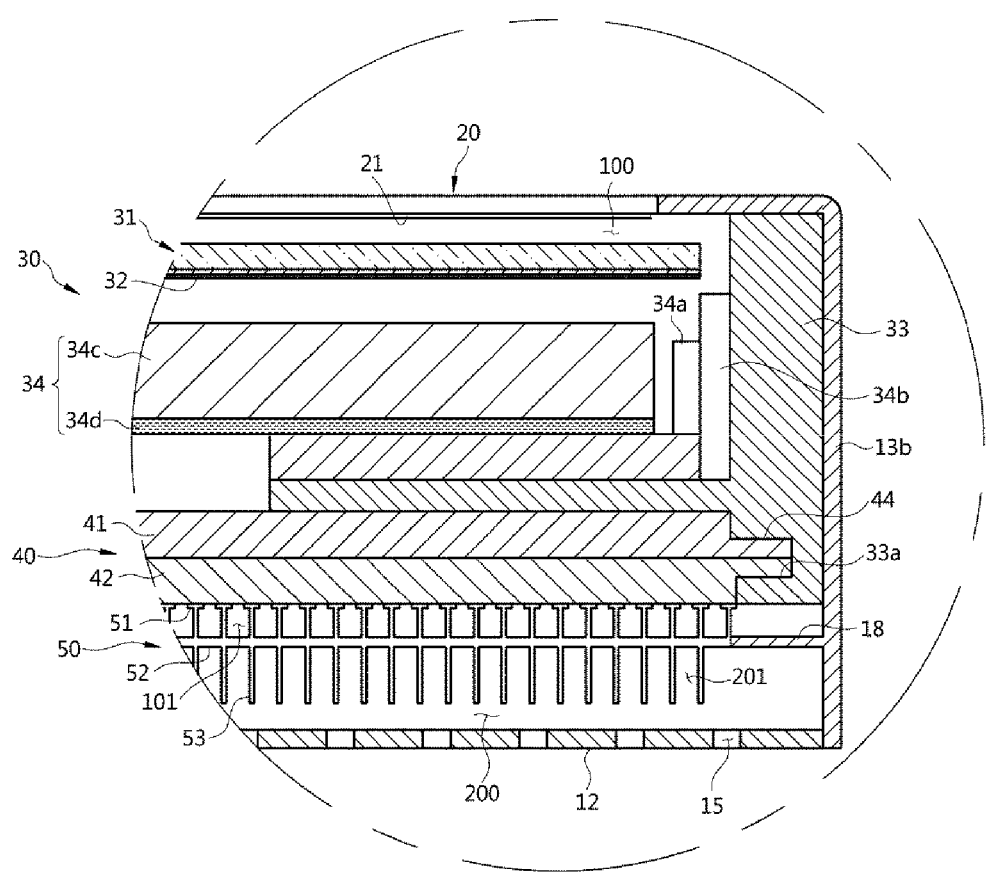
FIG. 6 is a cross-sectional view illustrating the display device taken along the line A-A' of FIG. 1.

Meanwhile, referring to FIG. 6, the display module 30 may include a display panel 31 for displaying images thereon, and a backlight unit 34 disposed at the rear of the display panel 31 to provide light to the display panel 31.

The display device 1 may include at least one circuit board 70 configured to drive the display module 30 by applying a signal to the display panel 31. Various control units (e.g., CPU (Central Processing Unit), SMP (Symmetric MultiProcessing), etc.) configured to perform functions through transmission/reception of information may be mounted to the circuit board 70, and each control unit acting as a heating element may be configured to radiate heat.

The display device 1 may be deteriorated not only through heat generated from an internal part but also through heat generated by external sunlight, by the control units.

Therefore, the case 10 may include a cooling plate 40 and a heat exchange device 50 so as to maintain the internal temperature of the case 10 within a predetermined range.

The cooling plate 40 may be designed to form a rear surface of the display module 30 in the rear of the display module 30.

Figure 4:
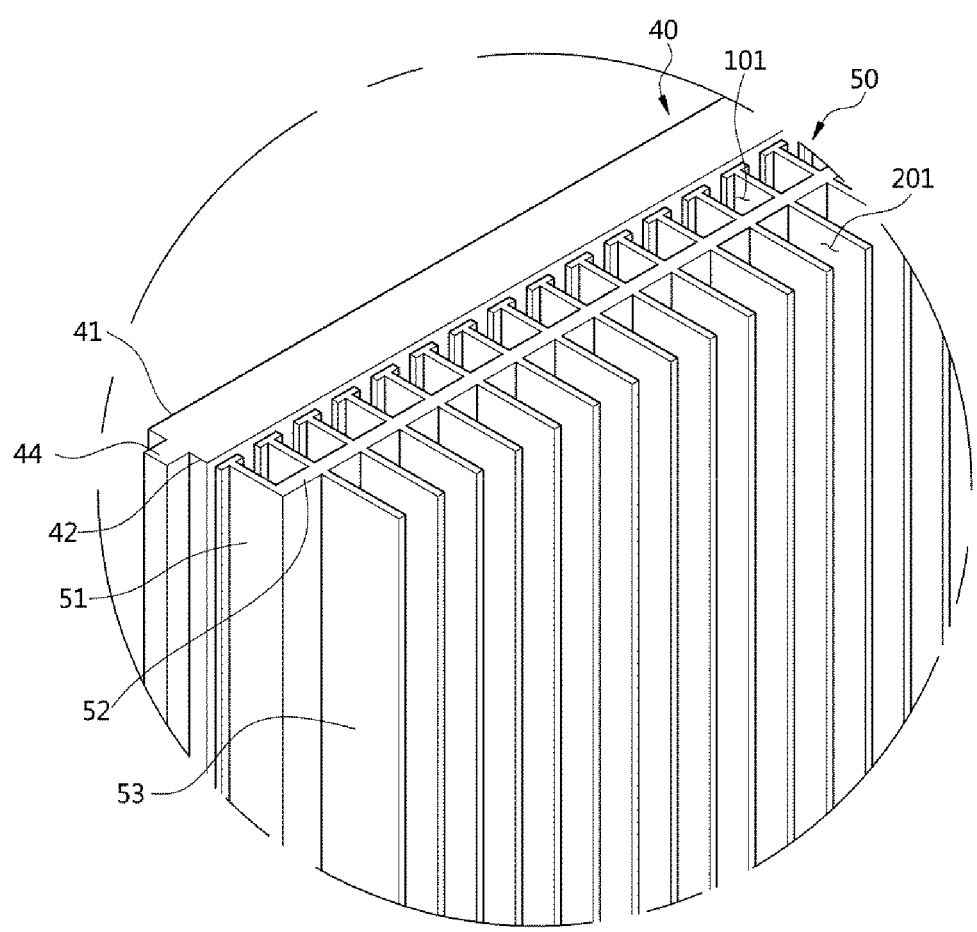
FIG. 4 is a view illustrating a heat exchange device coupled to a cooling plate according to an exemplary embodiment.

Referring to FIG. 4, the cooling plate 40 may be formed in a plate shape.

The plate-shaped cooling plate 40 may form the rear surface of the display module 30 such that the plate-shaped cooling plate 40 can efficiently dissipate heat generated from high-temperature heat sources (such as the display panel 31, the backlight unit 34, etc.) or can efficiently radiate heat.

The cooling plate 40 acting as a high-performance phase-change thermal conductor employing a phase change of refrigerant may include a large heat conduction plate.

In the exemplary embodiment, thermal conductivity of the cooling plate 40 may be 5000 kw/mK or higher.

The cooling plate 40 may include any one of copper (Cu), stainless steel, and aluminum (Al).

The cooling plate 40 may include a first cooling plate 41 configured to form an inner surface of the rear surface of the display module 30, and a second cooling plate 42 configured to form an outer surface of the rear surface of the display module 30.

The first cooling plate 41 and the second cooling plate 42 may be formed to have mutual corresponding shapes. The first cooling plate 41 may be coupled to the second cooling plate 42, resulting in formation of a plate shape.

A coupling unit 44 coupled to a middle mold 33 (also referred to as a mid-mold) of the display module 30 may be formed at opposite ends of the cooling plate 40 along a width direction of the case 10. Although the embodiment has exemplarily disclosed that the coupling unit 44 of the cooling plate 40 is a protrusion protruding outward for convenience of description, the scope or spirit of the present inventive concept is not limited thereto. For example, the coupling unit of the cooling plate may include a groove recessed inward.

The heat exchange device 50 may contact the second cooling plate 42 formed to the outer surface of the rear surface of the display module 30.

The heat exchange unit 50 may include any one of a heat sink, a heat pipe, and a cooling fin.

Figure 5:
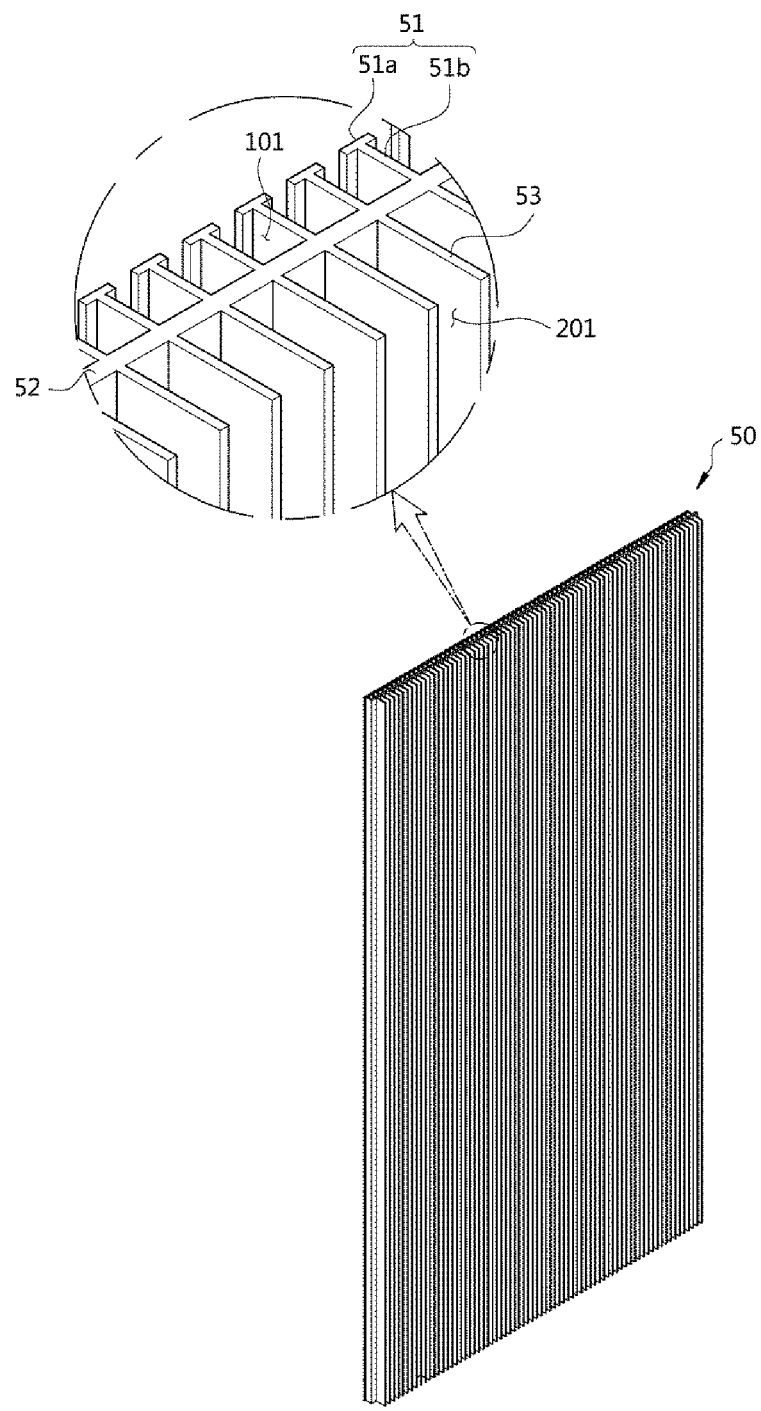
FIG. 5 illustrates a perspective view and an enlarged view of the heat exchange device according to an exemplary embodiment.

Referring to FIG. 5, the heat exchange device 50 may include a first portion 51 contacting the rear surface of the cooling plate 40, a plate-shaped panel unit 52 extended from the first portion 51, and a second portion 53 extended backward from the panel unit 52.

The first portion 51 of the heat exchange device 50 may include a contact surface 51a contacting the second cooling plate 42, and a contact support 51b extended perpendicular from the contact surface 51a.

The first portion 51 may be formed in a T shape. The first portion 51 may be formed to transfer heat from the second cooling plate 42 to the second portion 53 through the contact support 51b, such that heat from the second cooling plate 42 can be transferred to the second portion 53 by the contact surface 51a through conduction of heat. Although the embodiment has exemplarily disclosed that the first portion is formed in a T shape for convenience of description, the scope or spirit of the present inventive concept is not limited thereto. For example, the first portion may be formed in various shapes (for example, '⌐' or 'I' shape) including a contact surface and a support.

The second portion 53 formed in a fin shape protruding backward may include a plurality of fin shapes spaced apart from one another. The second portion 53 may be formed to radiate heat transferred from the first portion 51. Several fins may be spaced apart from one another by a predetermined distance.

The panel unit 52 may be configured to form a boundary between the first portion 51 and the second portion 53. The panel unit 52 may be curved in a direction perpendicular to the contact support 51b in a manner that the panel unit 52 is parallel to the contact surface 51a of the first portion 51.

In addition, the panel unit 52 may be connected to a barrier 18 installed in the case 10.

The barrier 18 may be disposed in each of the top surface 13a and the left side surface 13c of the case 10, and may also be disposed in the inner surface of the right side surface 13d. The barrier 18 may be coupled to an outer border of the panel unit 52, such that a front region and a rear region can be partitioned on the basis of the panel unit 52.

That is, the heat exchange device 50 may include a first flow passage 101 of the first portion 51 disposed at the front region with respect to the panel unit 52, and a second flow passage 201 of the second portion 53 disposed at the rear region with respect to the panel unit 52.

The first flow passage 101 may be disposed between the first portion 51 of the heat exchange device 50 and the rear surface of the second cooling plate 42. That is, the first flow passage 101 may be disposed between the rear surface of the cooling plate 42 and a surface of the panel unit 52 from which the first portion 51 of the heat exchange device 50 protrude from.

In the exemplary embodiment, the air of the first flow passage 101 may fluctuate by the circulation fan 63.

The second flow passage 201 may be disposed between the case 10 and the second portion 53 of the heat exchange device 50. That is, the second flow passage 201 may be disposed between the case and a surface of the panel unit 52 from which the second portion 53 of the heat exchange device 50 protrude from. The air of the second flow passage 201 may fluctuate by the cooling fan 17. The cooling fan 17 may suction or discharge the air, and may include the circulation fan 63 and a fan motor (not shown).

The cooling fan 17 disposed in the second flow passage 201 may suction the outside air through the inlet 14a, and may discharge the suctioned air to the outlet 15 through the second portion 53 (i.e., the second flow passage 201) of the heat exchange device 50.

The barrier 18 may be formed to be sealed with the panel unit 52 of the heat exchange device 50 according to the sealing standard IP65 or greater.

Referring to FIG. 6, the display device 1 according to the exemplary embodiment may include a cooling plate 40 provided at the rear of the display module 30; a first cooling passage 100 configured to perform sealing circulation of the air by the heat exchange device 50 contacting the cooling plate 40; and a second cooling passage 200 through which the outside air is heat-exchanged and discharged.

The inner space of the case 10 may be partitioned into the first cooling passage 100 and the second cooling passage 200 by the heat exchange device 50 and the barrier 18.

In the exemplary embodiment, the first cooling passage 100 formed to be sealed may include a space between the glass 20 of the front surface of the case 10 and the display panel 31 and the first flow passage 101.

The second cooling passage 200 may include a space between the rear surface 12 of the case 10 and the second flow passage 201.

Meanwhile, the display module 30 may include a display panel 31; a plurality of optical sheets 32 disposed at the rear of the display panel 31; a backlight unit 34 disposed at the rear of the display panel 31 so as to provide light; and a mid-mold 33 formed to support the display panel 31.

The backlight unit 34 may include a light guide plate 34c disposed at the rear of the display panel 31; a reflective sheet 34d disposed at the rear of the light guide plate 34c; and a plurality of LEDs 34a to provide light to the light guide plate 34c. Although the exemplary embodiment has exemplarily disclosed that the light guide plate 34c is disposed at the rear of the display panel 31 and the LEDs 34a are disposed at the side of the light guide plate 34c such that light is irradiated from the side of the light guide plate 34c, the scope or spirit of the present inventive concept is not limited thereto. For example, the LEDs may be disposed to face the rear surface of the display, such that light may also be directly applied to the rear surface of the display panel.

The mid-mold 33 supporting the display panel 31 may include a coupling groove 33a in which the coupling unit 44 of the cooling plate 40 is installed.

The cooling plate 40 may be provided at the rear of the display module 30 by inserting the coupling unit 44 into the coupling groove 33a of the mid-mold 33.

Therefore, heat generated from the display panel 31, the backlight unit 34, and the LEDs 34a may be conducted through the cooling plate 40.

In the exemplary embodiment, the cooling plate 40 may absorb or emit high-temperature heat through large-area heat conduction, and at the same time may transmit the heat to the heat exchange device 50 contacting the surface of the cooling plate 40, resulting in increased cooling efficiency.

A temperature sensor 71 configured to measure the temperature may be installed in the case 10 as shown in FIG. 3, and may include a controller 80 configured to adjust the circulation fan 63 and the cooling fan 17 according to the sensing signal of the temperature sensor 71.

Figure 7:
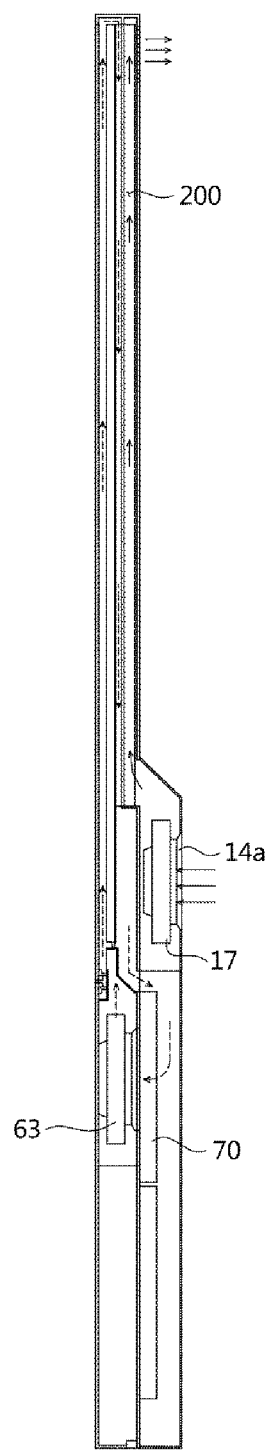
FIG. 7 is a cross-sectional view illustrating the display device taken along the line B-B' of FIG. 1.
Figure 8:
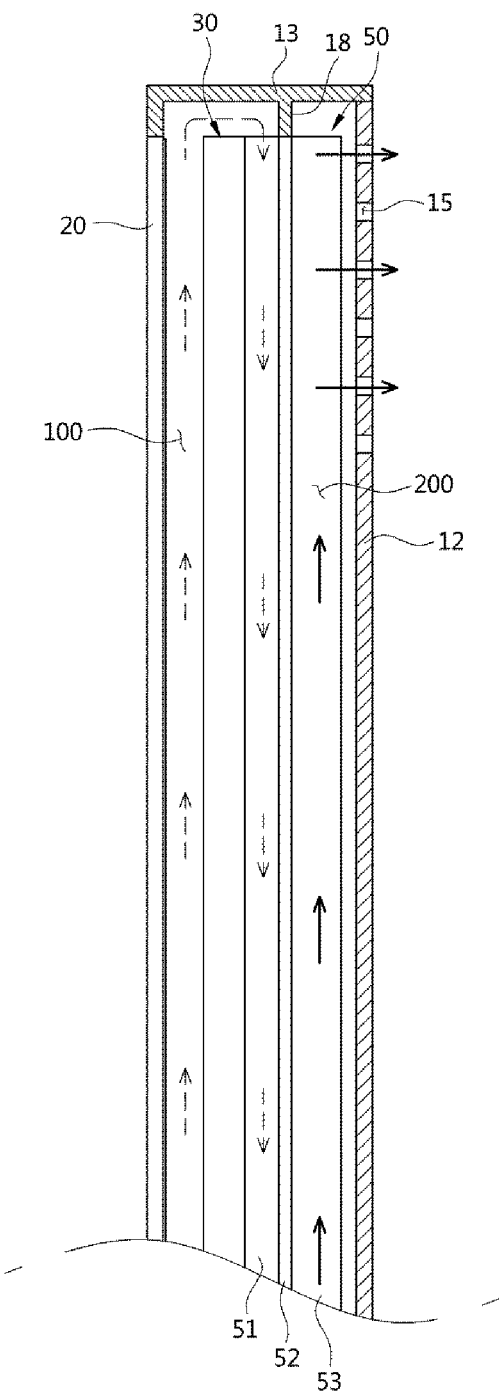
FIG. 8 is a schematic diagram illustrating an upper part of a first cooling passage and a second cooling passage of the display device according to an exemplary embodiment.
Figure 9:
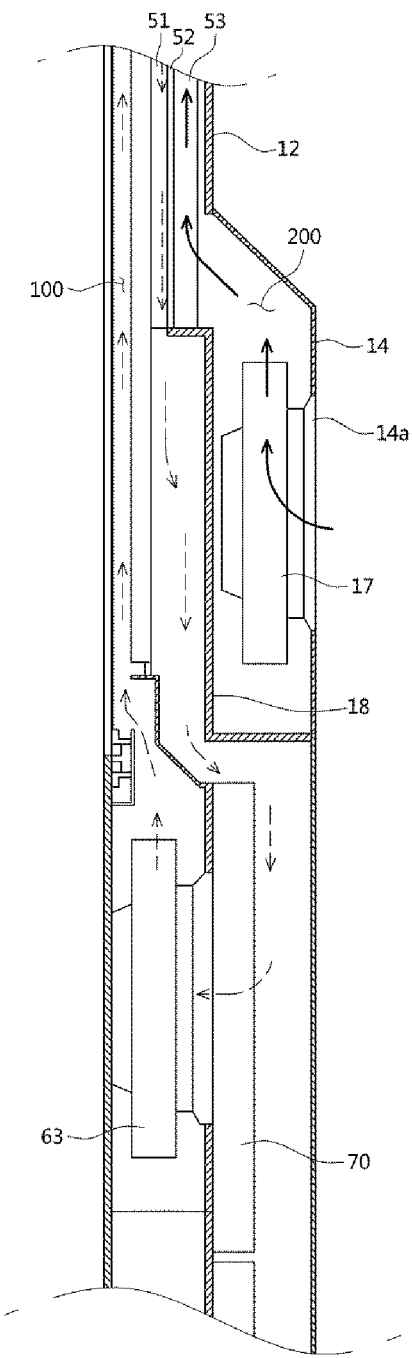
FIG. 9 is a schematic diagram illustrating a lower part of a first cooling passage and a second cooling passage of the display device according to an exemplary embodiment.

Referring to FIGS. 7 to 9, the movement process of the air fluctuating in the first cooling passage 100 and the second cooling passage 200 will hereinafter be described.

If the display panel 31 is driven by applying a signal to the display module 30 of the display device 1, heat is radiated by the backlight unit 34, the circuit board 70, etc.

In addition, because the display device 1 is installed outdoors, solar radiation or the like is incident upon the display device 1 through the glass 20, resulting in heat radiation.

In the exemplary embodiment, the cooling plate 40 provided at the rear of the display module 30 may absorb or radiate heat generated from the display module 30 through large-area heat conduction.

In addition, the heat exchange device 50 contacting the rear surface of the cooling plate 40 may absorb heat transferred to the cooling plate 40 through the contact unit 51, such that the absorbed heat can be emitted through the second portion 53 located at the rear end.

Meanwhile, the first flow passage 101 formed by the cooling plate 40 and the first portion of the heat exchange device 50 may be coupled to the space between the glass 20 and the display panel 31, such that the air can be circulated in a sealed manner (i.e., in a closed-loop manner).

In addition, the air of the first cooling passage 100 absorbs solar heat incident upon the front surface of the display panel 31 according to air flow formed by the circulation fan 63, such that the air which has absorbed heat may transfer the absorbed heat to the cooling plate 40 and the heat exchange device 50 through the first flow passage 101 formed at the rear of the display panel 31. Thereafter, the air is cooled and moves to the front part of the display panel 31 by the circulation fan 63, resulting in formation of a closed-loop circulation passage.

The first flow passage 100 forming the sealed circulation is isolated from the external part, and entry of external moisture or dust into the display device can be prevented.

The outside air is introduced into the second cooling passage 200 through the suction inlet 14a and the cooling fan 17 formed at the rear surface of the case 10, the introduced air is guided by the cooling fan 17, is heat-exchanged by passing through the heat exchange device 50, and is then discharged through the outlet 15.

Therefore, the display module 30 disposed in the case 10 may be primarily cooled by the first cooling passage 100 in which sealed circulation is achieved, and may be secondarily cooled not only by the outside air fluctuating in the second cooling passage 200 but also by the heat exchange device 50, resulting in increased cooling efficiency.

The second cooling passage 200 may include at least one circuit board 70 configured to control the operation of the display device 1, and the circuit board 70 may be cooled simultaneously with operation of the circulation fan 63 of the second cooling passage 200.

Figure 10:
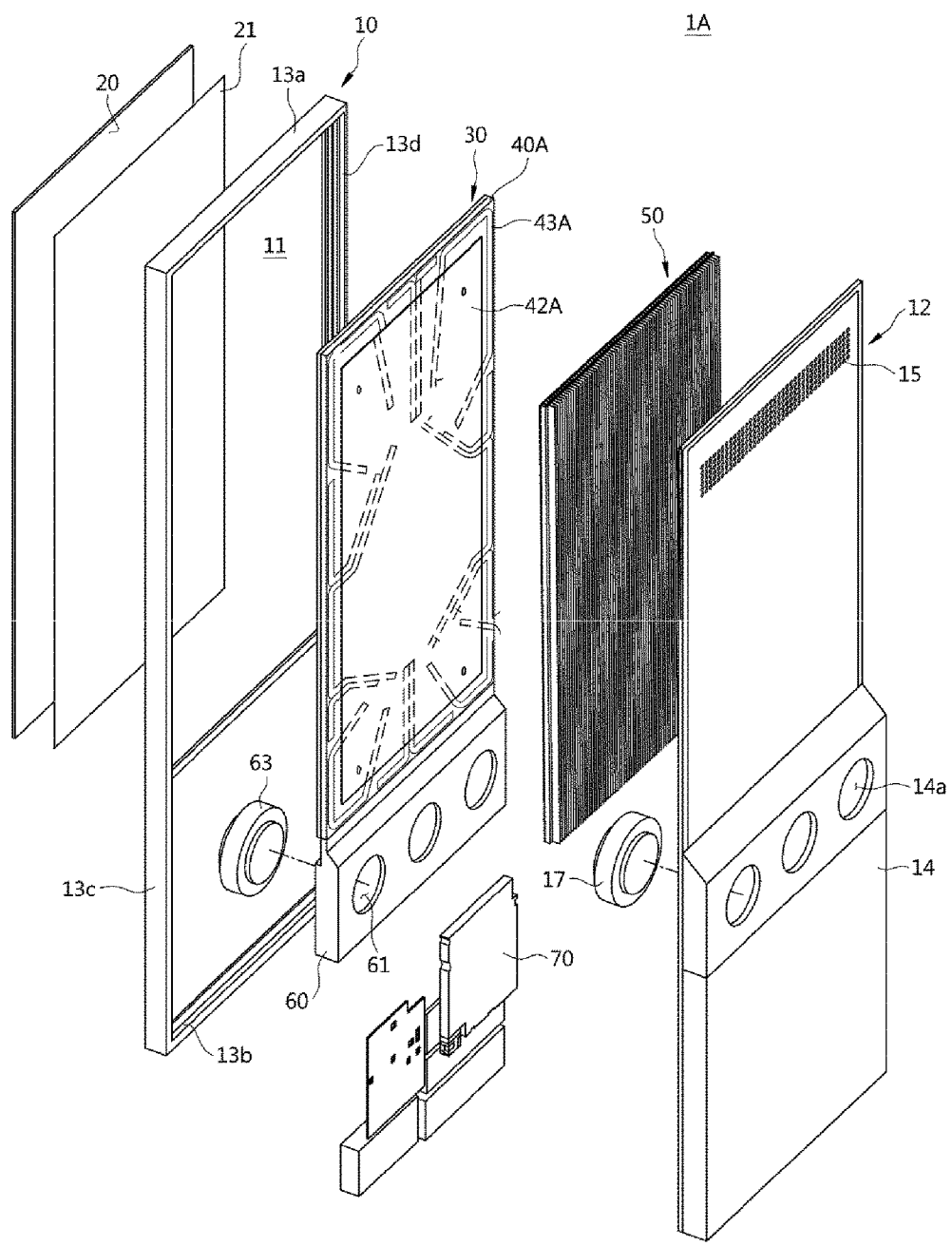
FIG. 10 is an exploded perspective view illustrating a display device according to an exemplary embodiment.
Figure 11:
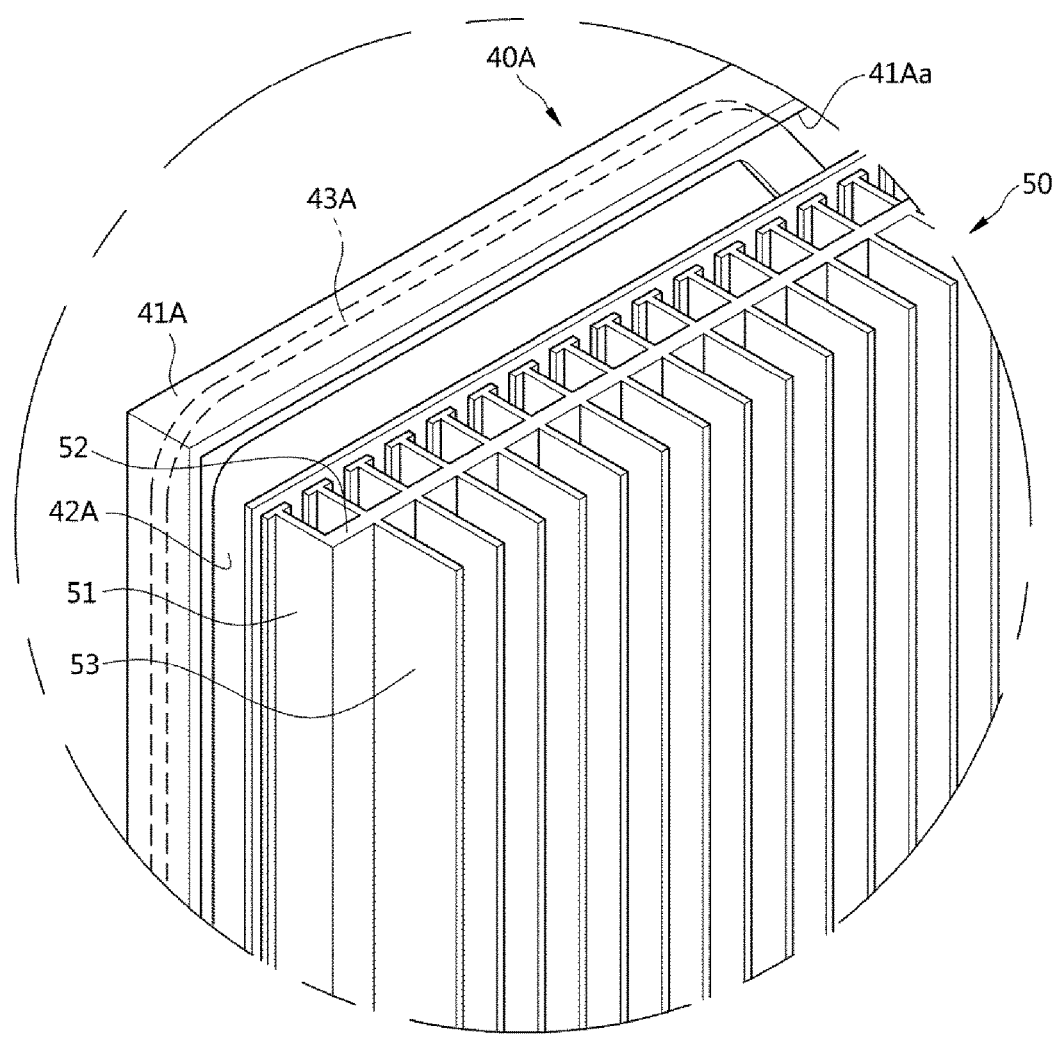
FIG. 11 is a schematic diagram illustrating coupling between a cooling plate and a heat exchange device according to an exemplary embodiment.

FIG. 10 is an exploded perspective view illustrating a display device according to an exemplary embodiment. FIG. 11 is a schematic diagram illustrating coupling between a cooling plate and a heat exchange device according to an exemplary embodiment.

Referring to FIGS. 10 to 11, the cooling plate 40A of the display device 1A according to an exemplary embodiment may include a heat pipe 43A.

The cooling plate 40A may include a hexahedral main body 41A, one side of which is opened; a heat pipe 43A disposed in the main body 41A; and a fixing plate 42A formed to fix the heat pipe 43A to the main body 41A.

A plurality of heat pipes 43A may be provided. The heat pipes 43A may be spaced outward from the center point of the main body 41A, such that the heat pipes 43A may be arranged in a radial shape.

In the exemplary embodiment, the heat pipes 43A arranged in the radial shape may be arranged to evenly dissipate heat received from the display panel 31 and the backlight unit 34.

The fixing plate 42A may be configured to fix the heat pipe 43A to the main body 41A. In the exemplary embodiment, the fixing plate 42A may be formed of a metal material having high thermal conductivity.

The main body 41A of the cooling plate 40A may be coupled to the mid-mold 33 supporting the display panel 31, such that the main body 41A can be provided at the rear of the display module 30.

The fixing plate 42A may contact the heat exchange device 50.

The contact unit 51 of the heat exchange device 50 may contact the fixing plate 42A of the cooling plate 40A, such that the contact unit 51 absorbs heat of the cooling plate 40A and the absorbed heat is emitted through the second portion 53.

The operations of the first cooling passage 100 and the second cooling passage 200 formed by the cooling plate 40A and the heat exchange device 50 according to an exemplary embodiment can also be used in the same manner as in the above exemplary embodiment, and as such a detailed description thereof will herein be omitted for convenience of description.

Figure 12:
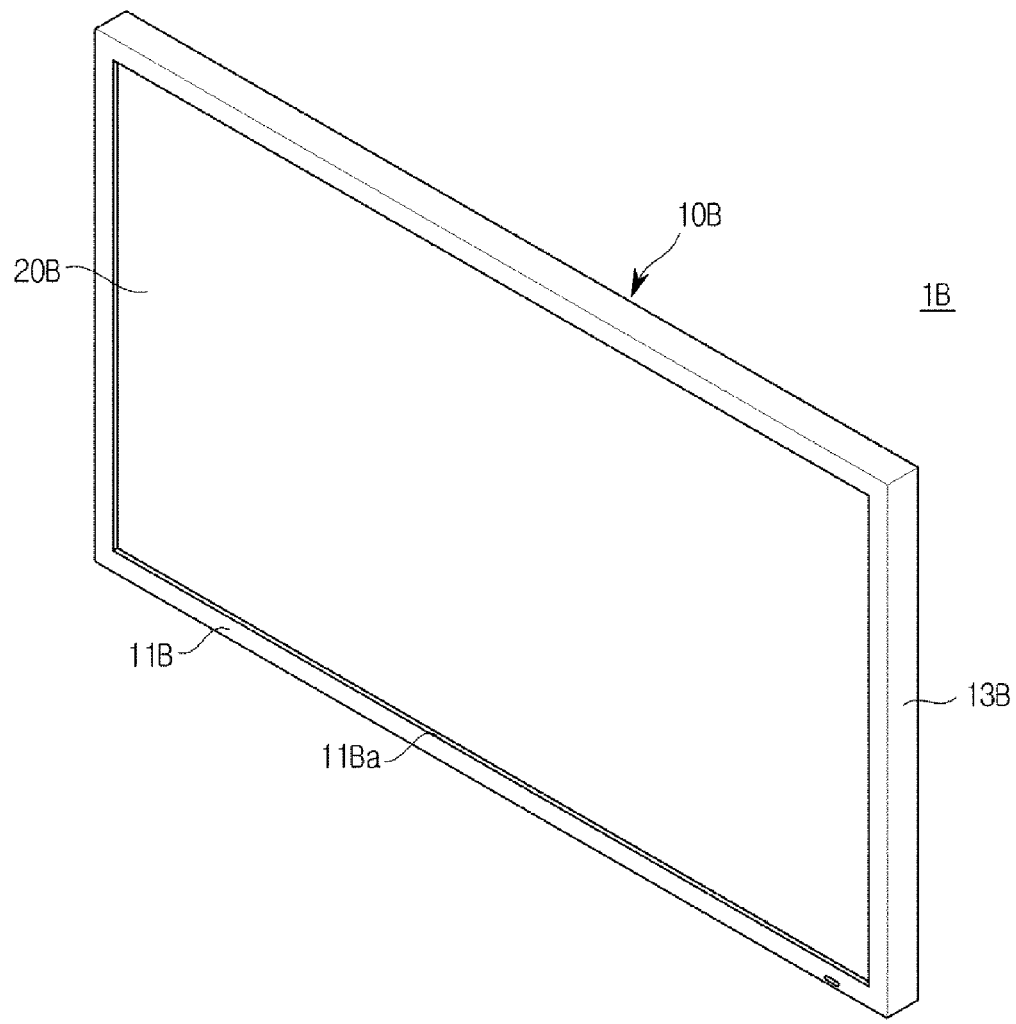
FIG. 12 is a perspective view illustrating a display device according to an exemplary embodiment.
Figure 13:
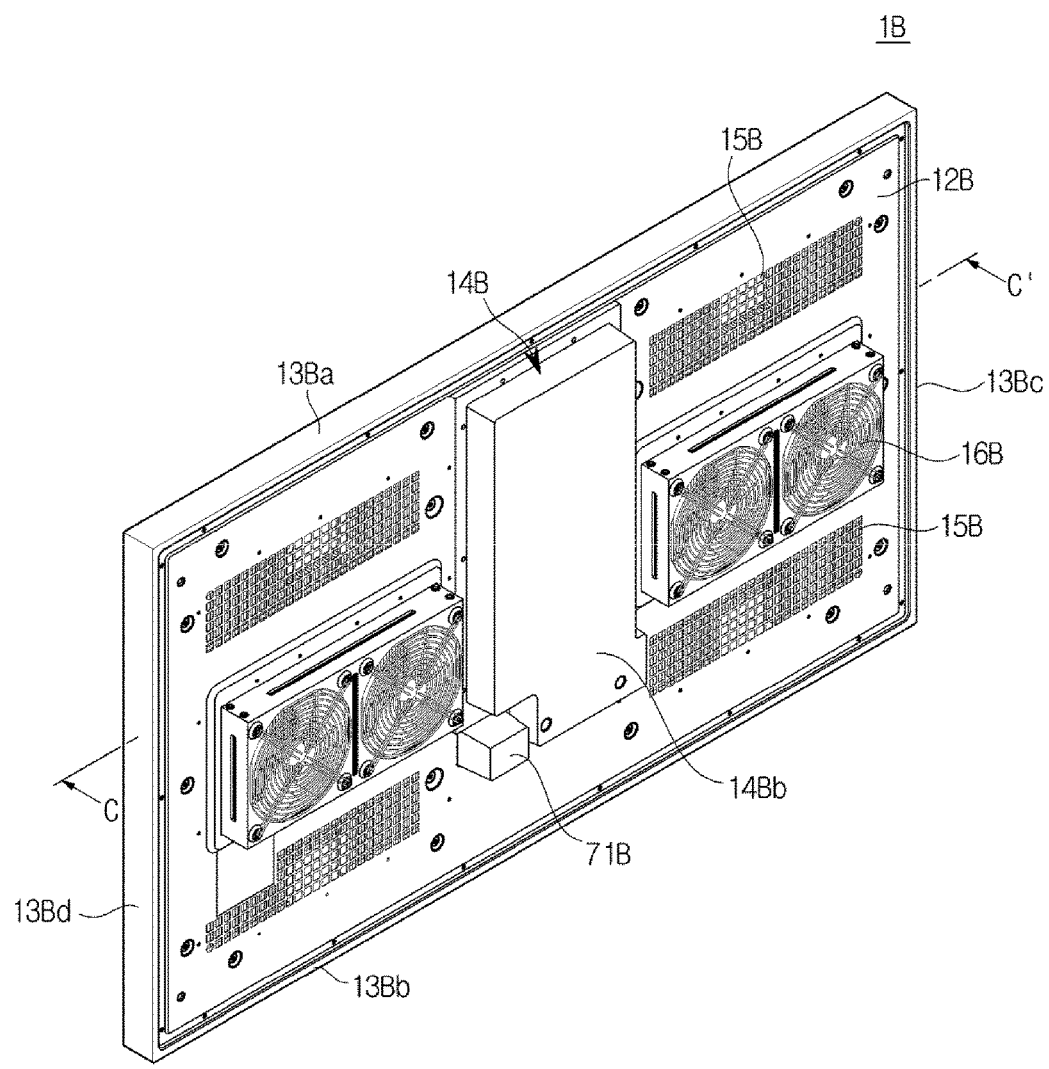
FIG. 13 is a rear perspective view illustrating a display device according to an exemplary embodiment.
Figure 14:
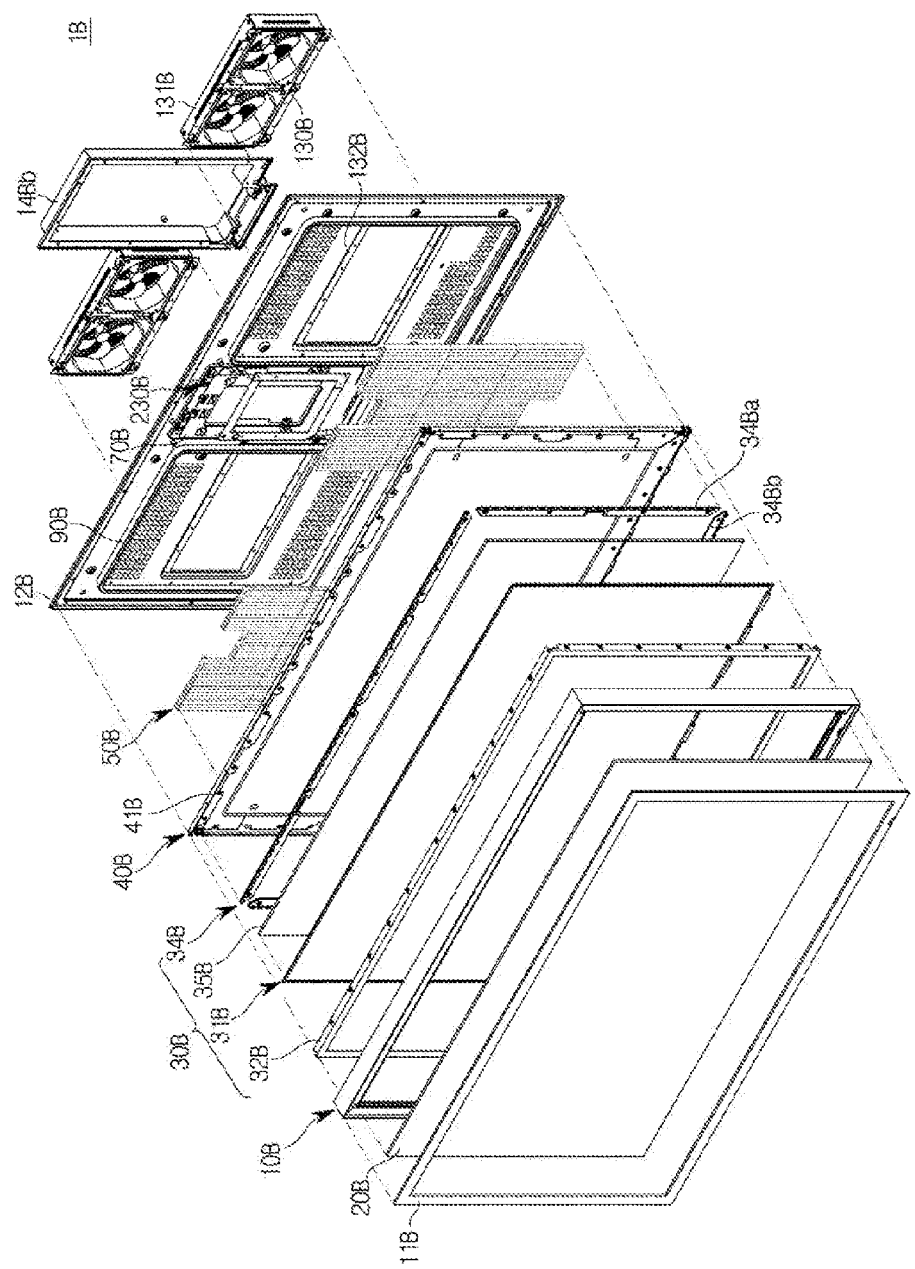
FIG. 14 is an exploded perspective view illustrating a display device according to an exemplary embodiment.
Figure 15:
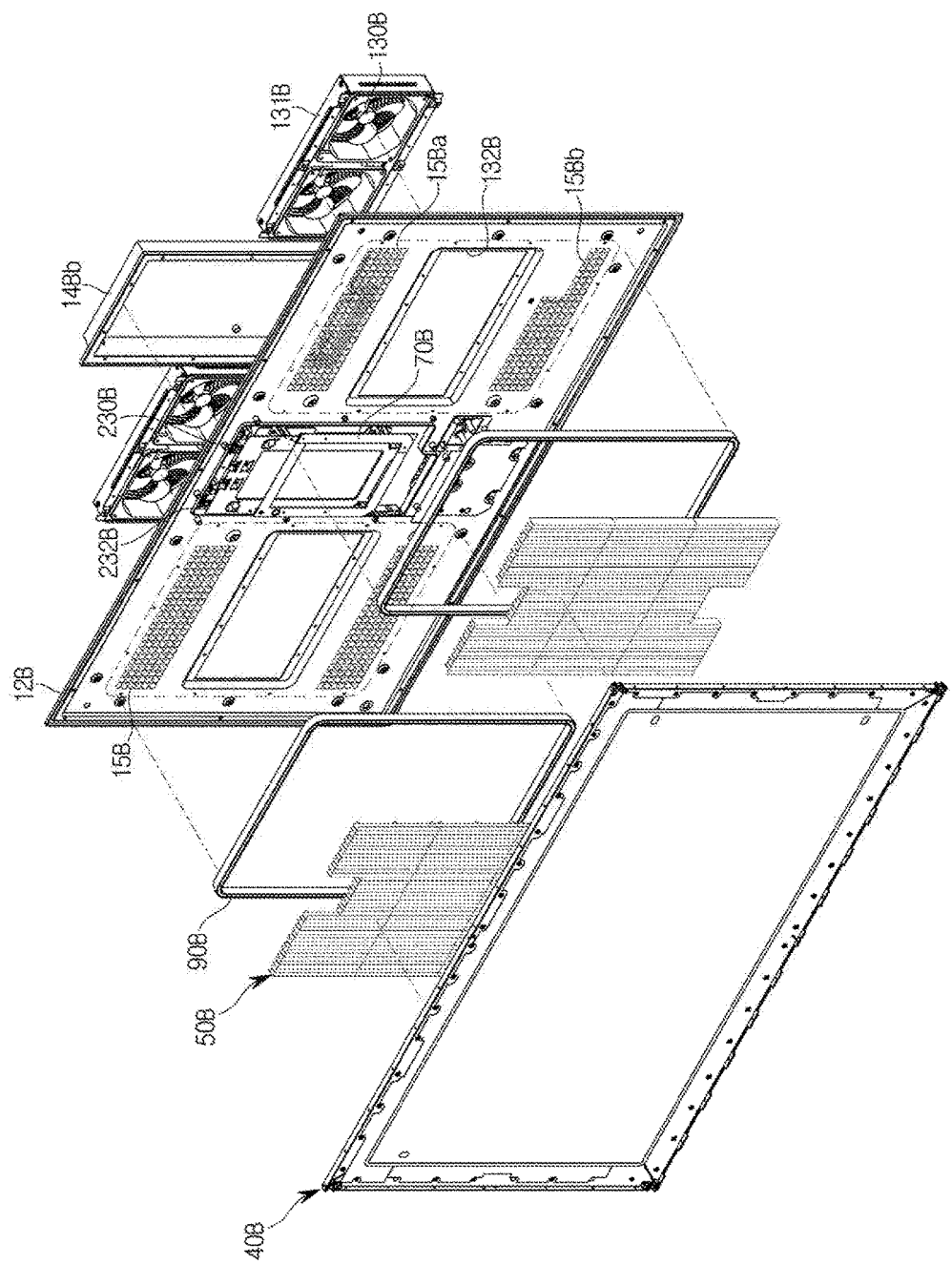
FIG. 15 is an exploded perspective view illustrating a cooling structure of the display device according to an exemplary embodiment.
Figure 16:
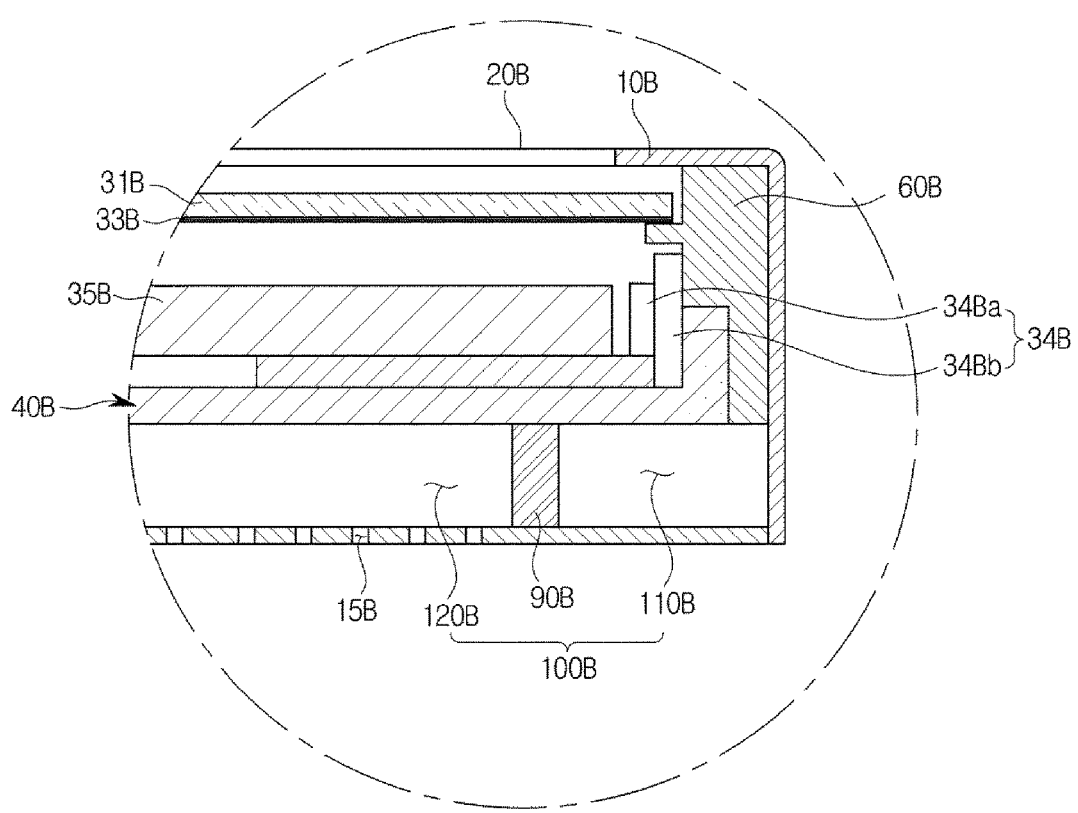
FIG. 16 is a partial cross-sectional view illustrating the display device taken along the line C-C' of FIG. 13.

FIG. 12 is a perspective view illustrating a display device 1B according to an exemplary embodiment. FIG. 13 is a rear perspective view illustrating a display device 1B according to an exemplary embodiment. FIG. 14 is an exploded perspective view illustrating a display device 1B according to an exemplary embodiment. FIG. 15 is an exploded perspective view illustrating a cooling structure of the display device 1B according to an exemplary embodiment. FIG. 16 is a partial cross-sectional view illustrating the display device 1B taken along the line C-C' of FIG. 13.

Referring to FIGS. 12 to 16, the display device 1B according to an exemplary embodiment may include a case 10B forming the external appearance thereof; and a display module 30B formed to display images in the inside of the case 10B.

The case 10B may include an opening 11Ba located forward. A glass 20B may be disposed in the opening 11Ba of the front part of the case 10B.

The case 10B of the display device 1B may be installed outdoors, and may include a front surface 11B, a rear surface 12B, and a plurality of side surfaces 13B coupled between the front surface 11B and the rear surface 12B. The side surfaces 13B may include a top surface 13Ba, a bottom surface 13Bb, a left side surface 13Bc, and a right side surface 13Bd.

The glass 20B formed in the opening 11Ba of the front surface 11B may be formed of a transparent material including a transparent member (such as tempered glass) having superior hardness or rigidity.

In addition, the glass 20B may be formed to have a predetermined size corresponding to the display module 30B contained in the case 10B, such that a user located outdoors can view images displayed on the display module 30B installed in the case 10B.

A plurality of inlets 16B and a plurality of outlets 15B may be formed at the rear surface of the case 10B. The inlets 16B may be formed to suction the outside air from the case 10B. The outlets 15B may be formed to discharge the air suctioned through the inlets 16B to the outside. Although the embodiment has exemplarily disclosed that each of the inlets 16B and the outlets 15B includes a plurality of holes for convenience of description, the scope or spirit of the present inventive concept is not limited thereto. For example, each of the inlets and the outlets may include a slit, etc. formed when at least some parts of the rear surface of the case are severed.

The inlets 16B may be respectively disposed at the left and right parts of the center portion of the rear surface 12B of the case 10B, and the outlets 15B may be respectively disposed at the upper and lower parts of the inlets 16B.

The case 10B may include a display module 30B and a frame 60B (FIG. 16) supporting the display module 30B.

The frame 60B may be fixed in the top surface 13Ba and the bottom surface 13Ba of the case 10B, and may be fixed in the left side surface 13Bc and the right side surface 13Bd, such that the frame 60B can support the display module 30B. Although the embodiment has exemplarily disclosed that the frame is incorporated with the inside of the case for convenience of description, the scope or spirit of the present inventive concept is not limited thereto. For example, the frame 60B may be provided separately from the case and then installed.

The display module 30B disposed in the case 10B may include a display panel 31B for displaying images thereon; and a backlight unit 34B provided at the rear of the display panel 31B to provide light to the display panel 31B.

The backlight unit 34B may include a light source 34Ba configured to provide light to the display panel 31B and a light source frame 34Bb; a light guide plate 35B configured to convert light generated from the light source 34Ba into a plane light; and an optical member 33B configured to improve luminous efficiency.

The light source 34Ba may be arranged at the side of the light guide plate 35B. Although the embodiment has exemplarily disclosed that the light source 34Ba is arranged at four-directional sides of the light guide plate 35B for convenience of description, the scope or spirit of the present inventive concept is not limited thereto. The light source may be provided in at least one of the sides of the light guide plate 35B.

The optical members 33B configured to provide luminous efficiency may be used.

The optical members 33B may be formed to refract or scatter light such that a viewing angle and brightness of the display module 30B can be increased.

The optical members 33B may include various sheets, for example, a diffusion sheet, a prism sheet, a protective sheet, etc.

The front surface of the display panel 31B may be supported by a rectangular ring-shaped top chassis 32B as shown in FIG. 14. The cooling plate 40B may contact some parts of the top chassis 32B. For example, the inner side of a lateral part of the top chassis 32B may contact the installation unit 41B formed in the borders of the cooling plate 40B. In addition, the cooling plate 40B may also be coupled to the frame 60B.

The display device 30B may include at least one circuit board 70B configured to drive the display module 30B by applying a signal to the display panel 31B. Various control units (e.g., CPU, SMP, etc.) configured to perform functions through transmission/reception of information may be mounted to the circuit board 70B, and each control unit acting as a heating element may be configured to radiate heat. The display device 1B may be deteriorated not only through heat generated from an internal part but also through heat generated by external sunlight, by the control units.

In addition, the light source 34Ba of the backlight unit 34B contained in the display module 30B may emit light and heat, resulting in deterioration of the display panel 31B.

Therefore, the case 10B may include a cooling plate 40B to maintain the internal temperature of the case 10B within a predetermined range and a cooling passage 100B to radiate heat of the cooling plate 40B.

The cooling plate 40B may be designed to form the rear surface of the display module 30B at the rear of the display module 30B.

The plate-shaped cooling plate 40B may form the rear surface of the display module 30B so as to efficiently dissipate heat generated from high-temperature heat sources (such as the display panel 31B, the backlight unit 34B, etc.) or can efficiently radiate heat.

The cooling plate 40B acting as a high-performance phase-change thermal conductor employing a phase change of refrigerant may include a large heat conduction plate.

In the exemplary embodiment, thermal conductivity of the cooling plate 40B may be 5000 kw/mK or higher.

The cooling plate 40B may include any one of copper (Cu), stainless steel, and aluminum (Al).

A plurality of cooling passages 100B for cooling the cooling plate 40B may be disposed at the rear of the cooling plate 40B.

A heat transfer member 50B may be formed at the rear surface of the cooling plate 40B. The heat transfer member 50B may contact at least some parts of the rear surface of the cooling plate 40B. The heat transfer member 50B may be disposed at the rear surface 12B of the case 10B of the display device 1B.

A partition member 90B may be provided in the vicinity of the heat transfer member 50B. The partition member 90B may be spaced outward from the heat transfer member 50B by a predetermined distance. The partition member 90B may be formed to isolate the cooling plate 40B from the rear surface 12B of the case 10B.

Although the embodiment has exemplarily disclosed that two heat transfer members 50B are respectively arranged at the left and right sides of the cooling plate 40B for convenience of description, the scope or spirit of the present inventive concept is not limited thereto. For example, three or more heat transfer members may be used according to the size and shape of the display device.

The heat transfer member 50B may be contained in the heat exchange device configured to receive heat from the cooling plate 40B and perform heat exchange and heat radiation. In the exemplary embodiment, the heat transfer member 50B may include any one of a heat sink, a heat exchanger, and a heat pipe.

The partition member 90B may include an elastic material, for example, rubber or silicon. The partition member 90B may be formed in a rectangular ring shape.

Although the embodiment has exemplarily disclosed that the partition member 90B is separately installed at the rear surface 12B of the case 10B for convenience of description, the scope or spirit of the present inventive concept is not limited thereto. For example, the partition member 90B may be integrally formed with the case 10B as necessary.

Meanwhile, the cooling passage 100B may be disposed between the cooling plate 40B and the rear surface 12B of the case 10B.

Figure 17:
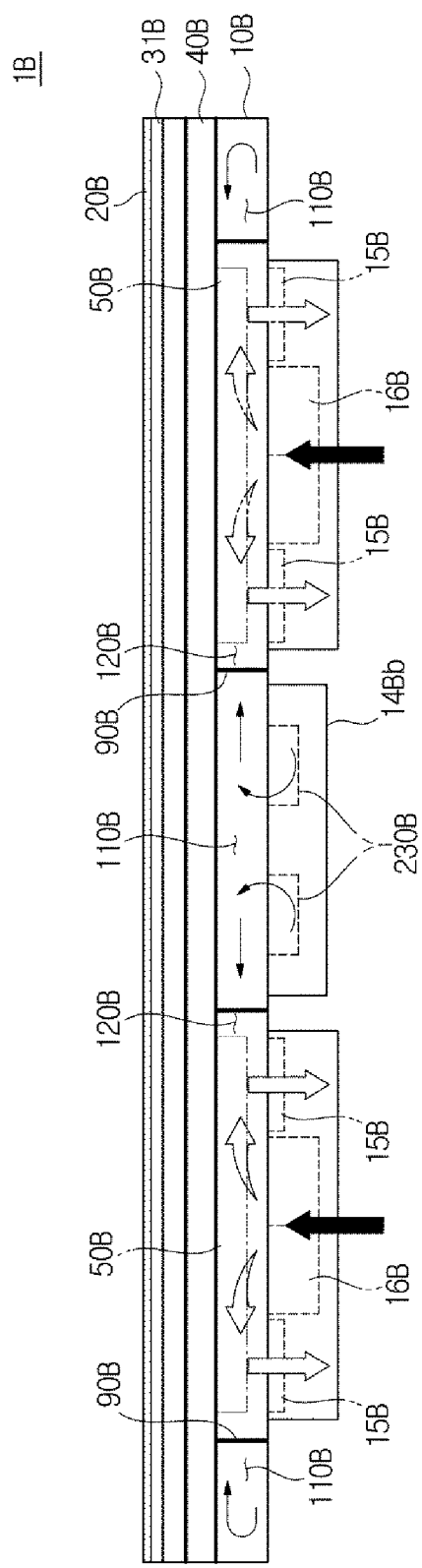
FIG. 17 is a schematic diagram illustrating a cooling passage of the display device according to an exemplary embodiment.
Figure 18:
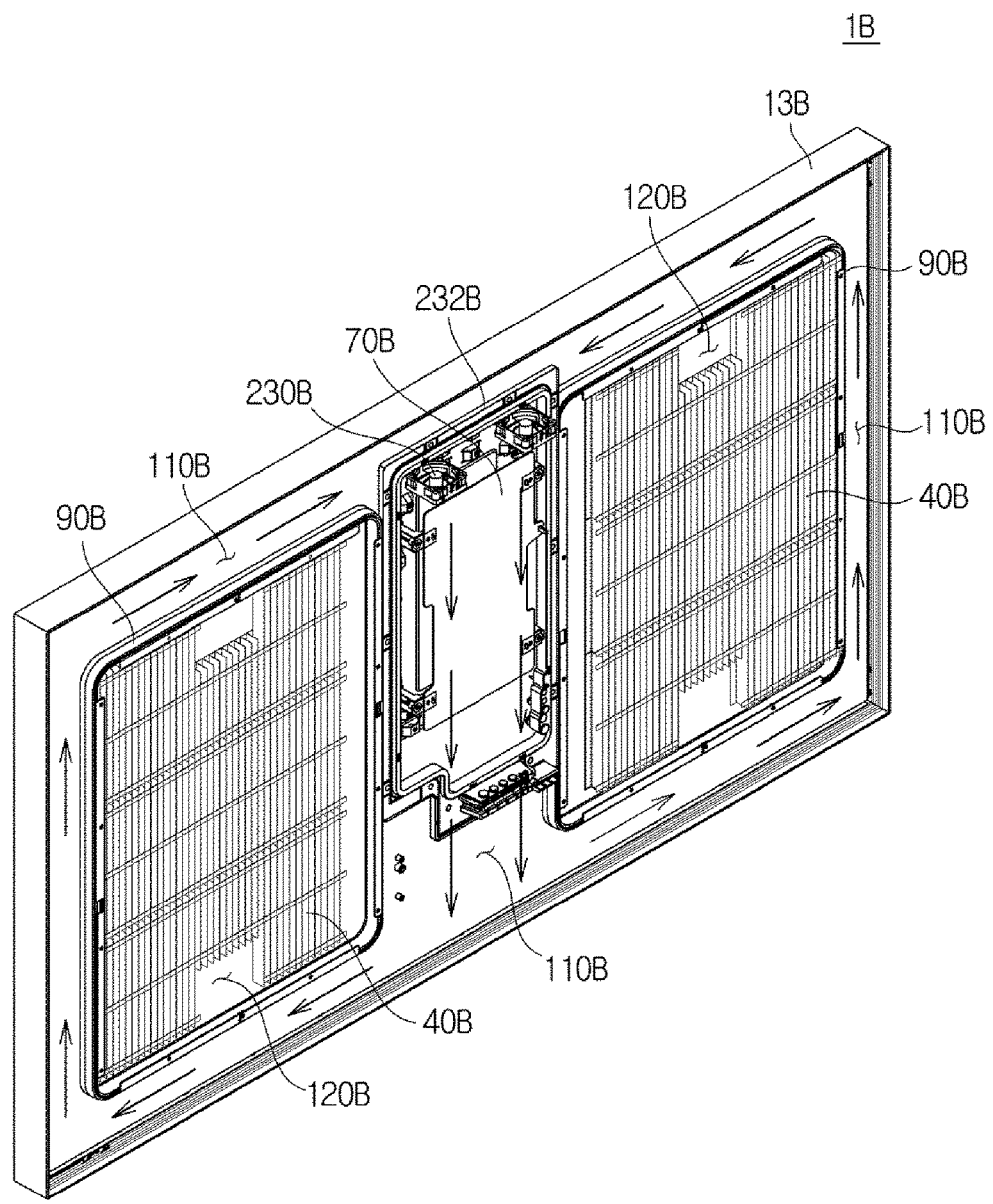
FIG. 18 is a schematic view illustrating a first cooling passage according to an exemplary embodiment.
Figure 19:
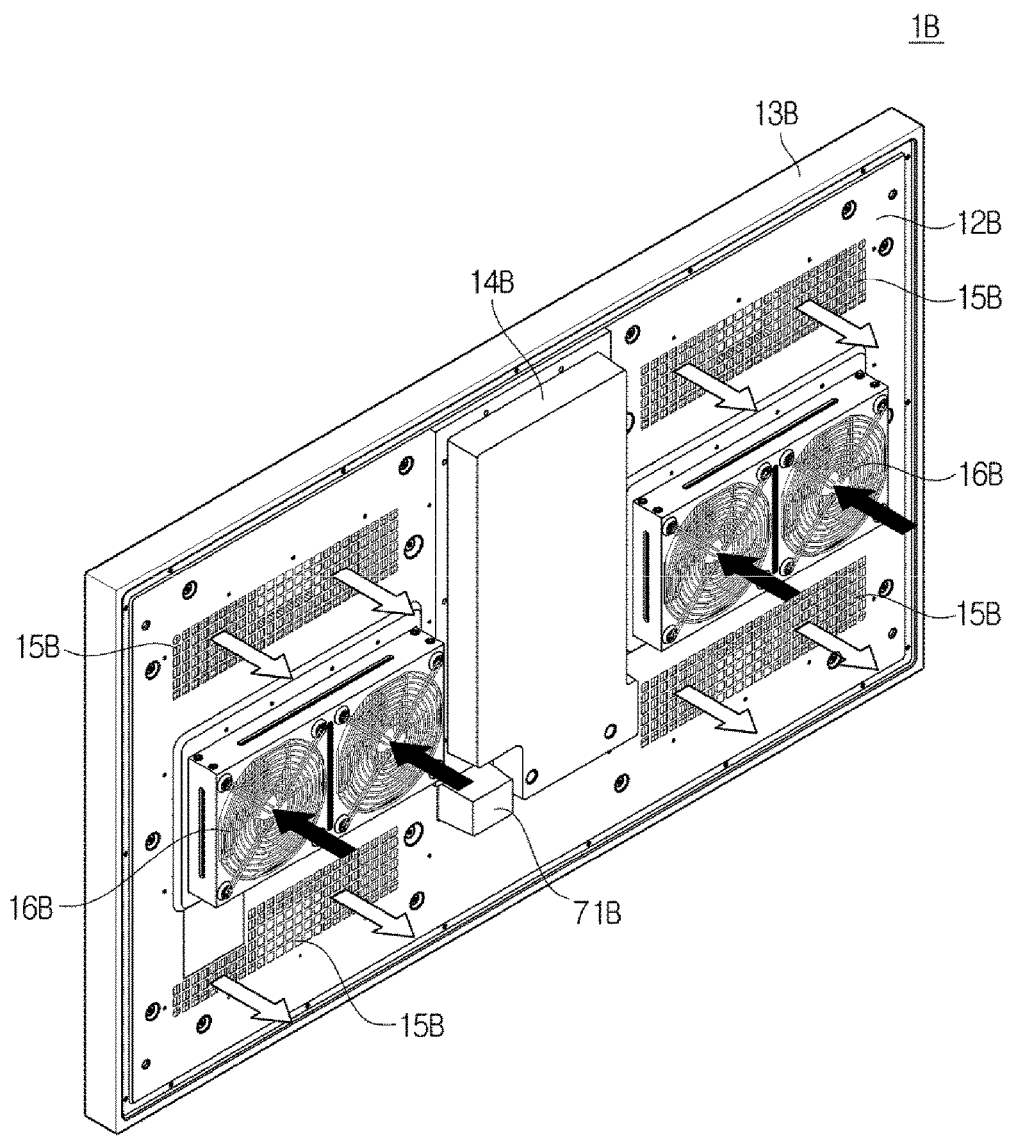
FIG. 19 is a perspective view illustrating a second cooling passage according to an exemplary embodiment.

FIG. 17 is a schematic diagram illustrating a cooling passage 100B of the display device according to an exemplary embodiment. FIG. 18 is a schematic view illustrating a first cooling passage according to an exemplary embodiment. FIG. 19 is a perspective view illustrating a second cooling passage according to an exemplary embodiment.

The cooling passage 100B may be formed to radiate heat of the cooling plate 40B, and may include the first cooling passage 110B and the second cooling passage 120B.

The first cooling passage 110B and the second cooling passage 120B may be isolated from each other. The partition member 90B may be formed to isolate the first cooling passage 110B from the second cooling passage 120B. The first cooling passage 110B may be formed along the outer circumference of the partition member 90B.

The first cooling passage 110B may be formed to circulate the outer vicinity of the partition member 90B. The second cooling passage 120B may be isolated from the first cooling passage 110B. The second cooling passage 120B may be formed in the partition member 90B.

The first cooling passage 110B may be disposed not only at the center part of the rear surface of the display panel 20B in a widthwise direction of the display device 1B but also at the border of the display panel 20B in the widthwise direction of the display device 1B. The partition member 90B may isolate the first cooling passage 110B from the second cooling passage 120B, and may guide movement of the internal air of the first cooling passage 110B.

A circulation fan 230B for circulating the air of the first cooling passage 110B may be located over the first cooling passage 110B.

A circulation fan installation unit 230B for installation of the circulation fan 230B may be disposed at the center of the rear surface 12B of the case 10B in the widthwise direction of the display device 1B. The circulation fan installation unit 232B may be recessed backward at the center of the rear surface 12B of the case 10B. At least one circulation fan 230B may be installed at the upper end of the circulation fan installation unit 232B. Although the embodiment has exemplarily disclosed that two circulation fans 230B are arranged parallel to each other for convenience of description, the scope or spirit of the present inventive concept is not limited thereto.

In addition, a plurality of circuit boards 70B configured to drive the display device 1B may be installed at the circulation fan installation unit 232B.

The plurality of circuit boards 70B may be disposed over the first cooling passage 110B. The first cooling passage 110B may include the circulation fan installation unit 232B in which the circulation fan 230B is installed.

The air circulated by the circulation fan 230B may move in the display device 1B along the first cooling passage 110B and the external side of the partition member 90B. The air moving around the outer periphery of the partition member 90B contained in the display device 1B may form a single closed loop. That is, the air may move and circulate along both sides and the upper side at the lower side of the partition member 90B and the circulation fan installation unit 232B disposed at the center of the display panel 20B, and may cool the cooling plate 40B.

The circulation fan 230B may increase movement speed of the air that is closed-circulating (or seal-circulating) in the first cooling passage 110B of the display device 1B, such that temperature reduction can be accelerated.

The closed-circulation cooling passage may prevent dust and foreign substances from entering the display device 1B. Separation or isolation from the external environment may improve durability of the display device 1B.

In addition, the second cooling passage 120B may be formed in the partition member 90B. The second cooling passage 120B may be disposed between the rear surface of the cooling plate 40B and the rear surface 12B of the case 10B. The second cooling passage 120B may include a suction inlet 16B for suctioning the outside air; and an outlet 15B through which the air suctioned through the inlet 16B is heat-exchanged through the heat transfer member 50B and discharged to the outside.

The suction inlet 16B and the outlet 15B may be formed in the rear surface 12B of the case 10B. The cooling fan 130B for suctioning the outside air may be disposed at the rear surface 12B of the case 10B. A cooling fan installation unit 132B for installation of the cooling fan 130B may be formed at the rear surface 12B of the case 10B.

The cooling fan installation unit 132B may be located at a position corresponding to the second cooling passage 120B. The cooling fan installation unit 132B may be located at the center of the second cooling passage 120B. The cooling fan installation units 132 may be respectively formed at the left and right sides of the rear surface 12B of the case 10B. The cooling fan cover 131B formed to accommodate the cooling fan 130B may be installed in the cooling fan installation unit 132B.

The inlet 16B for suctioning the outside air may be formed at the cooling fan cover 131B of the cooling fan installation unit 132B. That is, the outside air introduced into the center of the second cooling passage 120B through the inlet 16B formed in the cooling fan installation unit 132B may be introduced into the second cooling passage 120B, such that the cooling plate 40B can be cooled.

Although the embodiment has exemplarily disclosed that the cooling fan installation units 132B are respectively disposed at the left and right sides of the rear surface 12B of the case 10B, and two cooling fans 130B are installed in the cooling fan installation unit 132B for convenience of description, the scope or spirit of the present inventive concept is not limited thereto. For example, a plurality of cooling fans may be used according to the size and shape of the display device.

A heat transfer member 50B may be disposed in the second cooling passage 120B, and at least some parts of the heat transfer member 50B may contact the cooling plate 40B.

Therefore, the outside air introduced into the second cooling passage 120B may be heat-exchanged through the heat transfer member 50B contacting the surface of the cooling plate 40B, resulting in increased cooling efficiency.

In the exemplary embodiment, the air heat-exchanged in the second cooling passage 120B may be discharged through the outlets 15B formed in the rear surface 12B of the case 10B. The outlets 15B may be respectively formed at the upper and lower sides of the case 10B. The outlet 15B may be formed at the position corresponding to the second cooling passage 120B.

Although the embodiment has exemplarily disclosed that the outlets 15B are respectively formed at the upper and lower sides of the inlet 16B for convenience of description, the scope or spirit of the present inventive concept is not limited thereto. For example, a plurality of outlets may be formed according to the size and shape of the display device as necessary.

Cooling caused by direct entry of the outside air of the second cooling passage 120B may effectively dissipate internal heat, solar heat, etc.

A temperature sensor (not shown) configured to measure a temperature may be installed in the case 10B, and a controller 72B for adjusting the circulation fan 230B and the cooling fan 130B according to the sensing signal of the temperature sensor may be provided.

Therefore, the display device 1B may be adjusted either by temperature of the internal air and the outside air or by external illuminance. The circulation fan 230B adjusted by the controller 71B may move the air contained in the first cooling passage 110B, and the cooling fan 130B may move the air contained in the second cooling passage 120B.

The above-mentioned air movement of the first cooling passage 110B and the second cooling passage 120B may cool the cooling plate 40B.

Figure 20:
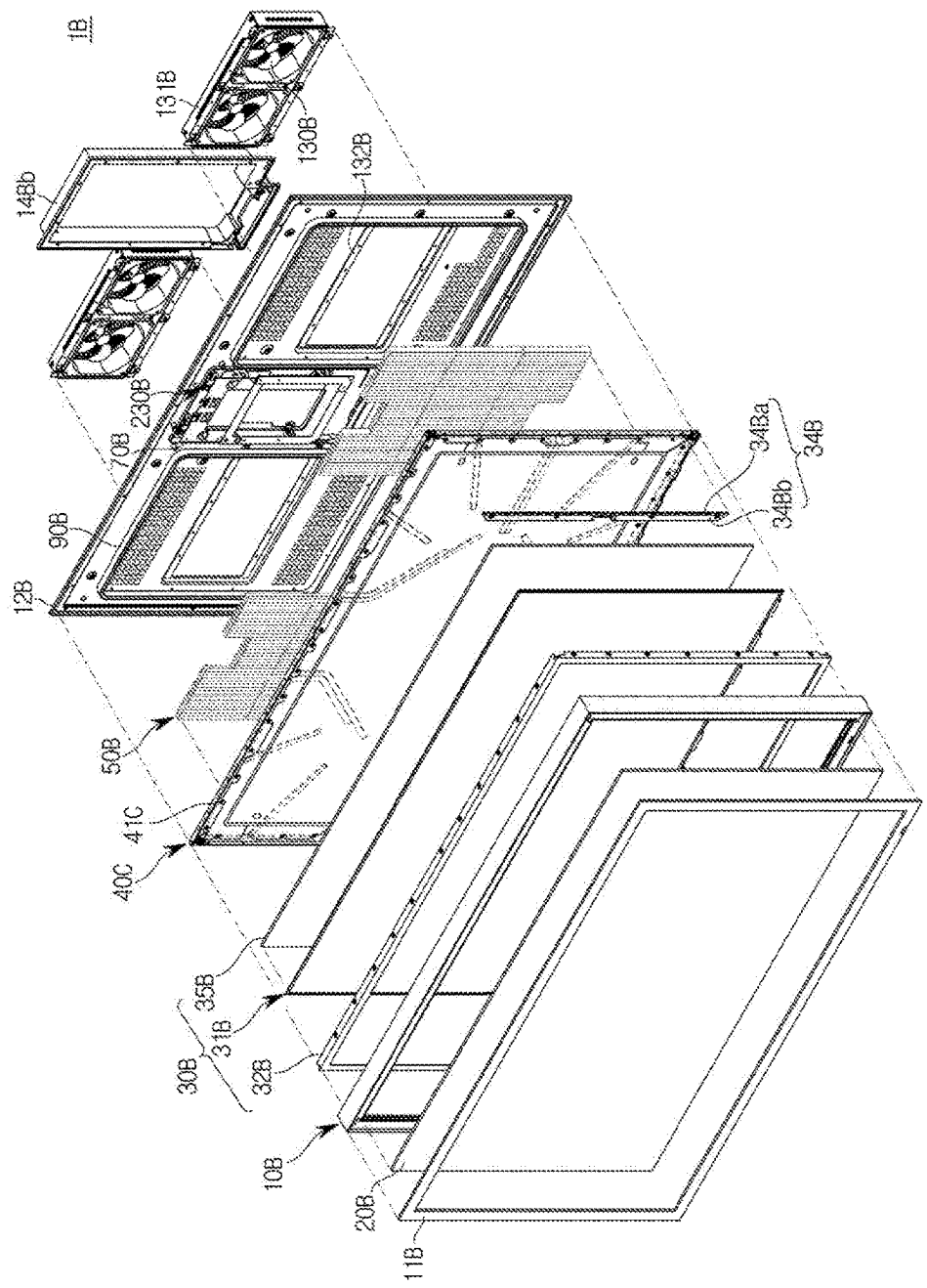
FIG. 20 is an exploded perspective view illustrating a display device according to an exemplary embodiment.
Figure 21:
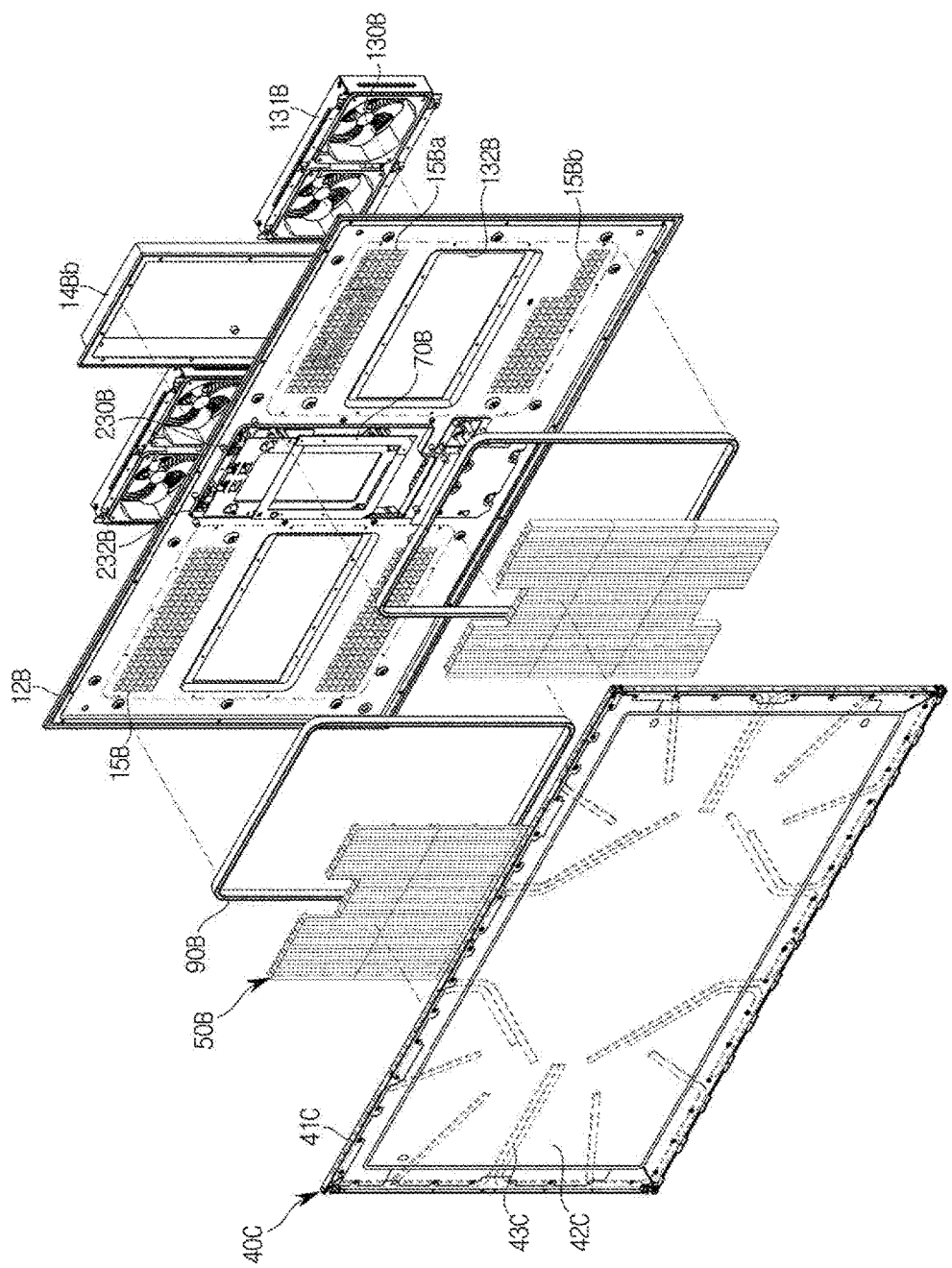
FIG. 21 is a view illustrating a cooling structure based on a cooling plate according to an exemplary embodiment.

FIG. 20 is an exploded perspective view illustrating a display device according to an exemplary embodiment. FIG. 21 is a view illustrating a cooling structure based on a cooling plate according to an exemplary embodiment.

Referring to FIGS. 20 and 21, the display device 1B according to an exemplary embodiment may include a case 10B forming the external appearance thereof; and a display module 30B formed to display images in the inside of the case 10B.

The case 10B may include an opening 11Ba located forward. A glass 20B may be disposed in the opening 11Ba of the front part of the case 10B.

The case 10B may be installed outdoors, and may include a front surface 11B, a rear surface 12B, and a plurality of side surfaces 13B coupled between the front surface 11B and the rear surface 12B. The side surface 13B may include a top surface 13Ba, a bottom surface 13Ba, a left side surface 13Bc, and a right side surface 13Bd.

A plurality of inlets 16B and a plurality of outlets 15B may be formed at the rear surface of the case 10B. The inlets 16B may be formed to suction the outside air from the case 10B. The outlets 15B may be formed to discharge the air suctioned through the inlets 16B to the outside.

Meanwhile, the inlets 16B may be respectively disposed at the left and right parts of the center portion of the rear surface 12B of the case 10B, and the outlets 15B may be respectively disposed at the upper and lower parts of the inlets 16B.

The case 10B may include a display module 30B and a frame 60B supporting the display module 30B. The frame 60B may be fixed in the top surface 13Ba and the bottom surface 13Ba of the case 10B, and may be fixed in the left side surface 13Bc and the right side surface 13Bd, such that the frame 60B can support the display module 30B. Although the embodiment has exemplarily disclosed that the frame is incorporated with the inside of the case for convenience of description, the scope or spirit of the present inventive concept is not limited thereto. For example, the frame may be provided separately from the case and then installed.

In the meantime, the display module 30B disposed in the case 10B may include a display panel 20B for displaying images thereon; and a backlight unit 34B provided at the rear of the display panel 20B to provide light to the display panel 20B.

The backlight unit 34B may include a light source 34Ba configured to provide light to the display panel 31B, a light source frame 34Bb; a light guide plate 35B configured to convert light generated from the light source 34Ba into a plane light; and an optical member 33B configured to improve luminous efficiency.

The light source 34Ba may be formed to provide light to at least one of plural side surfaces of the light guide plate 35B.

The optical members 33B may be formed to refract or scatter light such that a viewing angle and brightness of the display module 30B can be increased. The optical members 33B may include various sheets, for example, a diffusion sheet, a prism sheet, a protective sheet, etc.

The front surface of the display panel 31B may be supported by a rectangular ring-shaped top chassis 32B. The cooling plate 40B may contact some parts of the top chassis 32B. For example, the inner side of a lateral part of the top chassis 32B may contact the installation unit 41B formed in the borders of the cooling plate 40B. In addition, the cooling plate 40B may also be coupled to the frame 60B.

Meanwhile, although the embodiment has exemplarily disclosed that several light sources 34Ba are disposed in at least one of side surfaces of the light guide plate 35B for convenience of description, the scope or spirit of the present invention is not limited thereto. For example, several light sources 34Ba may be formed at the position corresponding to the rear surface of the display panel.

The display device 1B may include at least one circuit board 70B configured to drive the display module 30B by applying a signal to the display panel 31B. Various control units (e.g., CPU, SMP, etc.) configured to perform functions through transmission/reception of information may be mounted to the circuit board 70B, and each control unit acting as a heating element may be configured to radiate heat. The display device 1B may be deteriorated not only through heat generated from an internal part but also through heat generated by external sunlight, by the control units.

In addition, the light source 34Ba of the backlight unit 34B contained in the display module 30B may emit light and heat, resulting in deterioration of the display panel 31B.

Therefore, the case 10B may include a cooling plate 40C to maintain the internal temperature of the case 10B within a predetermined range and a cooling passage 100B to radiate heat of the cooling plate 40C.

The cooling plate 40B may be designed to form the rear surface of the display module 30B at the rear of the display module 30B.

The cooling plate 40C may include a heat pipe 43C.

The cooling plate 40C may include a plate-shaped plate 42C and a heat pipe 43C disposed in the plate 42C.

A plurality of heat pipes 43C may be provided. The heat pipes 43C may be spaced outward from the center point of the cooling plate 42C, such that the heat pipes 43C may be arranged in a radial shape.

In the exemplary embodiment, the heat pipes 43C arranged in the radial shape may be arranged to evenly dissipate heat received from the display panel 31C and the backlight unit 34C.

Meanwhile, the installation unit 41C may be formed at the four-directional borders of the plate 42C. The installation unit 41C may be formed to support the backlight unit 34C. The installation unit 41C may contact some parts of the top chassis 32B and be coupled thereto.

The heat transfer member 50B may contact the rear surface of the cooling plate 40C, such that it can absorb or radiate heat of the cooling plate 40C.

In the meantime, the first cooling passage 110B and the second cooling passage 120B formed by the cooling plate 40C and the heat transfer member 50B according to another embodiment can be operated in the same manner as in the above embodiment, and as such a detailed description thereof will herein be omitted for convenience of description.

As is apparent from the above description, the display device according to the embodiments has a sealed cooling passage and a circular cooling passage, resulting in improved cooling efficiency.

The display device according to the embodiments has a sealed cooling structure isolated from the outside air in a manner that the display device is isolated from the external environment, such that entry of external moisture or dust into the display device can be prevented, resulting in higher safety.

The display device according to the embodiments has no air filter, resulting in reduction of maintenance costs. The display device is formed in a slim shape, resulting in improved product appearance.

Although exemplary embodiments have been shown and described above, it would be appreciated by those skilled in the art that various changes may be made therein without departing from the principles and spirit of the invention, the scope of which is defined in the claims and their equivalents.

What is claimed is:

1. A display apparatus comprising:
   a case comprising:
      an inlet; and
      an outlet;
   a display module disposed in the case and comprising a display panel configured to display an image; and
   a heat exchange device configured to receive heat from the display module and comprising:
      a first portion provided in a first cooling passage, air in the first cooling passage moving over the display module;
      a second portion provided in a second cooling passage, air in the second cooling passage moving over the heat exchange device; and
      a panel unit disposed between the first portion and the second portion; and
   a cooling plate coupled to a rear surface of the display module and configured to receive the heat from the display module,
   wherein the first portion of the heat exchange device comprises a plurality of contact surfaces, disposed on the cooling plate and extending parallel to the panel unit, and a plurality of contact supports extending perpendicular to the plurality of contact surfaces a plurality of closed spaces being defined by the plurality of contact surfaces, the plurality of contact supports, the panel unit, and the cooling plate,
   wherein the heat from the display module is transferred to the first portion of the heat exchange device via the first cooling passage,
   wherein the heat transferred to the first portion is transferred to the second portion,
   wherein air suctioned through the inlet is heat-exchanged in the second cooling passage with the second portion and discharged to an exterior of the display apparatus through the outlet.

2. The display apparatus according to claim 1 further comprising a glass provided over at least one surface of the case and configured to protect the display module.

3. The display apparatus according to claim 1, wherein the cooling plate comprises a heat conduction plate, and includes at least one of copper (Cu), stainless steel, and aluminum (Al).

4. The display apparatus according to claim 1, wherein the case comprises a barrier configured to isolate the first cooling passage and the second cooling passage from each other.

5. The display apparatus according to claim 4, wherein the barrier is configured to connect the case and the heat exchange device.

6. The display apparatus according to claim 4,
   wherein the panel unit is configured to separate the first cooling passage and the second cooling passage from each other.

7. The display apparatus according to claim 6, wherein the barrier is coupled to the panel unit.

8. The display apparatus according to claim 1, wherein the heat exchange device comprises at least one of a heat sink, a heat pipe, and a plurality of cooling fins.

9. The display apparatus according to claim 1, wherein the first cooling passage is formed of a closed loop passage.

10. The display apparatus according to claim 1, wherein the first cooling passage includes a circulation fan configured to circulate the air in the first cooling passage.

11. The display apparatus according to claim 1, wherein the second cooling passage comprises a cooling fan configured to suction outside air into the case.

12. The display apparatus according to claim 1, further comprising:
a circuit board configured to control the display module, wherein the circuit board is provided over the second cooling passage.

13. A display apparatus including a display module provided in a case having an inlet and an outlet through which air suctioned into the display apparatus through the inlet is discharged outside, the display module configured to display an image, the display apparatus comprising:
a cooling plate disposed in the case, and configured to receive heat from the display module;
a heat exchange device contacting the cooling plate, and comprising:
a first portion provided in a first cooling passage, air in the first cooling passage moves over the display module;
a second portion provided in a second cooling passage, air in the second cooling passage moving over the heat exchange device; and
a panel unit disposed between the first portion and the second portion; and
a circulation fan provided over the first cooling passage to circulate the air in the first cooling passage,
wherein the first portion of the heat exchange device comprises a plurality of contact surfaces, disposed on the cooling plate and extending parallel to the panel unit, and a plurality of contact supports extending perpendicular to the plurality of contact surfaces, a plurality of closed spaces being defined by the plurality of contact surfaces, the plurality of contact supports, the panel unit, and the cooling plate,
wherein heat from the cooling plate is transferred to the first portion of the heat exchange device,
wherein the heat transferred to the first portion is transferred to the second portion, and
wherein the air suctioned through the inlet is heat-exchanged in the second cooling passage with the second portion and discharged to an exterior of the display apparatus through the outlet.

14. The display apparatus according to claim 13, wherein:
the inlet and the outlet are disposed over the second cooling passage; and
a cooling fan configured to suction the air through the inlet is disposed over the second cooling passage.

15. The display apparatus according to claim 14, wherein the case comprises a barrier configured to isolate the first cooling passage and the second cooling passage from each other.

16. The display apparatus according to claim 15, wherein the barrier is configured to connect the case and the heat exchange device.

17. The display apparatus according to claim 14, wherein the cooling plate includes a heat conduction plate, and comprises at least on of one of copper (Cu), stainless steel, and aluminum (Al).

18. The display apparatus according to claim 14, wherein the heat exchange device comprises at least one of a heat sink, a heat pipe, and a plurality of cooling fins.

19. The display apparatus according to claim 14, further comprising:
a circuit board configured to control the display module, wherein the circuit board is disposed over the second cooling passage.

20. A display apparatus comprising:
a case comprising:
an inlet; and
an outlet; and
a display module provided in the case,
wherein the display module comprises:
a display panel;
a cooling plate disposed at a rear of the display panel, and configured to transfer heat through phase change of refrigerant;
a heat transfer member configured to contact the cooling plate to form a closed space defined by the heat transfer member and the cooling plate;
a first cooling passage, air in the first cooling passage circulating around the heat transfer member; and
a second cooling passage, air suctioned through the inlet being heat-exchanged in the second cooling passage with the heat transfer member and the heat-exchanged air being discharged through the outlet,
wherein the heat transfer member comprises a plurality of contact surfaces, disposed on the cooling plate and extending parallel to the cooling plate, a plurality of contact supports extending perpendicular to the plurality of contact surfaces, and a panel unit extending from the plurality of contact supports in a direction parallel to the plurality of contact surfaces, and
wherein a plurality of closed spaces are defined by the plurality of contact surfaces, the plurality of contact supports, the panel unit, and the cooling plate.

21. The display apparatus according to claim 20, wherein the first cooling passage and the second cooling passage are isolated from each other.

22. The display apparatus according to claim 21, wherein the first cooling passage is formed of a closed loop passage, and comprises a circulation fan configured to move internal air of the first cooling passage.

23. The display apparatus according to claim 21, wherein the second cooling passage comprises a cooling fan configured to suction outside air.

24. The display apparatus according to claim 21, wherein the heat transfer member includes at least one of a heat sink and a heat exchanger.

25. The display apparatus according to claim 21 further comprising:
a circuit board configured to control the display module, wherein the circuit board is disposed over the first cooling passage.

26. The display apparatus according to claim 20 further comprising a partition member configured to isolate the first cooling passage and the second cooling passage from each other.

27. The display apparatus according to claim 26, wherein the partition member is arranged to surround the heat transfer member, and
wherein the partition member is configured to isolate the heat transfer member from the first cooling passage.

28. The display apparatus according to claim 26, wherein the partition member is made up of at least one of rubber, silicon, and elastic material.

29. The display apparatus according to claim 28, wherein the partition member is provided between the cooling plate and the case in a case thickness direction.

30. A display apparatus comprising:
a case comprising:
an inlet; and
an outlet; and
a display module provided in the case, wherein the display module comprises:
  a display panel;
  a cooling plate provided at a rear of the display panel, and configured to transfer heat through phase change of refrigerant;
  a first cooling passage configured to cool the cooling plate;
  a second cooling passage, air suctioned through the inlet being heat-exchanged with the cooling plate in the second cooling passage and the heat-exchanged air being discharged through the outlet; and
  a heat exchange device configured to contact the cooling plate,
wherein the second cooling passage is isolated from the first cooling passage,
wherein the heat exchange device comprises a plurality of contact surfaces, disposed on the cooling plate and extending parallel to the cooling plate, a plurality of contact supports extending perpendicular to the plurality of contact surfaces, and a panel unit extending from the plurality of contact supports in a direction parallel to the plurality of contact surfaces, and
wherein a plurality of closed spaces are defined by the plurality of contact surfaces, the plurality of contact supports, the panel unit, and the cooling plate.

31. The display apparatus according to claim 30, wherein the heat exchange device comprises at least one of a heat exchanger, a heat sink, and a heat pipe.

32. The display apparatus according to claim 31, wherein the heat exchange device is disposed over the first cooling passage.

33. The display apparatus according to claim 31, wherein the heat exchange device is disposed over the second cooling passage.

34. The display apparatus according to claim 30, further comprising:
  a glass provided over at least one surface of the case and configured to protect the display module.

35. The display apparatus according to claim 30, wherein the cooling plate comprises a heat conduction plate, and made with at least one of copper (Cu), stainless steel, and aluminum (Al).

36. The display apparatus according to claim 30, wherein:
  the cooling plate comprises a plurality of heat pipes,
  wherein the plurality of heat pipes are radially arranged outward from a center part of the cooling plate.

37. The display apparatus according to claim 30, wherein the first cooling passage is formed of a closed loop passage, and comprises a circulation fan configured to circulate internal air of the first cooling passage.

38. The display apparatus according to claim 30, wherein the second cooling passage comprises a cooling fan configured to suction outside air into the display apparatus.

* * * * *